(12) United States Patent
Sekiguchi et al.

(10) Patent No.: US 7,466,577 B2
(45) Date of Patent: Dec. 16, 2008

(54) SEMICONDUCTOR STORAGE DEVICE HAVING A PLURALITY OF STACKED MEMORY CHIPS

(75) Inventors: Tomonori Sekiguchi, Tokyo (JP); Hideki Osaka, Tokyo (JP); Tatemi Ido, Tokyo (JP); Osamu Nagashima, Tokyo (JP); Mitsuaki Katagiri, Tokyo (JP); Ichiro Anjo, Tokyo (JP)

(73) Assignees: Hitachi, Ltd., Intellectual Property Group, Tokyo (JP); Elpida Memory, Inc., Tokyo (JP)

( * ) Notice: Subject to any disclaimer, the term of this patent is extended or adjusted under 35 U.S.C. 154(b) by 275 days.

(21) Appl. No.: 11/392,805

(22) Filed: Mar. 30, 2006

(65) Prior Publication Data
US 2006/0233012 A1    Oct. 19, 2006

(30) Foreign Application Priority Data
Mar. 30, 2005    (JP)    ............................. 2005-098027

(51) Int. Cl.
G11C 5/02  (2006.01)
G11C 5/06  (2006.01)
H01L 23/02  (2006.01)
H01L 23/48  (2006.01)

(52) U.S. Cl. ........................... 365/51; 365/63; 257/686; 257/777

(58) Field of Classification Search .................... 365/51
See application file for complete search history.

(56) References Cited
U.S. PATENT DOCUMENTS

| 5,138,438 | A | * | 8/1992 | Masayuki et al. | ........... 257/686 |
| 5,198,888 | A | * | 3/1993 | Sugano et al. | .............. 257/686 |
| 5,563,086 | A | * | 10/1996 | Bertin et al. | .................. 438/15 |
| 5,581,498 | A | * | 12/1996 | Ludwig et al. | ................. 365/63 |
| 6,431,456 | B2 | * | 8/2002 | Nishizawa et al. | .......... 235/492 |
| 6,538,331 | B2 | * | 3/2003 | Masuda et al. | .............. 257/777 |
| 6,573,567 | B1 | * | 6/2003 | Nishizawa et al. | .......... 257/358 |
| 6,683,372 | B1 | * | 1/2004 | Wong et al. | ................. 257/686 |
| 7,061,105 | B2 | * | 6/2006 | Masuda et al. | .............. 257/723 |
| 7,102,905 | B2 | * | 9/2006 | Funaba et al. | ................. 365/51 |
| 7,123,497 | B2 | * | 10/2006 | Matsui et al. | ................. 365/51 |
| 7,200,021 | B2 | * | 4/2007 | Raghuram | .................... 365/51 |
| 7,215,561 | B2 | * | 5/2007 | Park et al. | ...................... 365/52 |

FOREIGN PATENT DOCUMENTS

| JP | 02-290048 | 11/1990 |
| JP | 2001-110978 | 4/2001 |
| JP | 2001-273755 | 10/2001 |
| JP | 2004-327474 | 11/2004 |

* cited by examiner

*Primary Examiner*—Son L Mai
(74) *Attorney, Agent, or Firm*—McDermott Will & Emery LLP

(57) ABSTRACT

A semiconductor storage employs a base substrate (101) having a command/address external terminal group (CA), a data input/output external terminal group (DQ), and a single chip select external terminal (CS), and also comprises a plurality of memory chips (110) to (113) mounted on a base substrate (101), each of which can individually carry out read and write operations. The terminals (CA), (DQ), and (CS) are connected to an interface chip (120). The interface chip (120) has a chip select signal generation circuit that can individually activate a plurality of memory chips (110) to (113) on the basis of an address signal fed by way of the terminal (CA) and on the basis of a chip select signal fed by way of the terminal (CS).

19 Claims, 22 Drawing Sheets

|  | COMMAND | SYMBOL | CS PUBLICATION METHOD |
|---|---|---|---|
| INITIALIZATION | Mode register set | MRS | Simultaneously activate all CS |
|  | Extended mode register set | EMRS |  |
| ROW SYSTEM | Auto refresh | REF | Sequentially activate with phase difference |
|  | Self refresh entry | SELF |  |
|  | Self refresh exit | SELFX | Simultaneously activate all CS |
|  | Single bank precharge | PRE | Activate CS stored in the active bank register |
|  | Precharge all banks | PALL |  |
|  | Bank activate | ACT | Select CS by decoding A14, 15 and store in active bank register |
| COLUMN SYSTEM | Write | WRIT | Activate CS stored in the active bank register |
|  | Write with auto precharge | WRITA |  |
|  | Read | READ |  |
|  | Read with auto precharge | READA |  |
| OTHER | No operation | NOP | Simultaneously activate all CS |
|  | Device deselect | DESL |  |
|  | Power down mode entry | PDEN |  |
|  | Power down mode exit | PDEX |  |

FIG.8

SEMICONDUCTOR STORAGE DEVICE HAVING A PLURALITY OF STACKED MEMORY CHIPS

TECHNICAL FIELD

The present invention relates to a semiconductor storage device, and more specifically relates to a semiconductor storage device that has a plurality of stacked memory chips.

BACKGROUND OF THE INVENTION

Semiconductor storage devices typified by DRAM (Dynamic Random Access Memory) are widely used as the main memory of servers and other computers, but with the increase in hardware speed and software complexity, the storage capacity required in main memory continues to increase. For this reason, it is difficult to meet the storage capacity needs required in main memory by using only a single memory chip, and a module referred as DIMM (Dual Inline Memory Module) in which a plurality of memory chips are mounted on a module substrate is ordinarily used.

However, the number of memory chips that can be mounted is low and the resulting storage capacity is limited when the memory chip is disposed in a flat configuration on a module substrate. Methods have been proposed in which a plurality of memory chips are three-dimensionally stacked and packaged, and the memory chips are mounted on a module substrate. See Japanese Patent Application Laid-Open Nos. H2-290048, 2001-110978, 2001-273755, and 2004-327474.

FIG. 22 is a schematic diagram of a conventional semiconductor storage device that is three-dimensionally stacked and packaged. The semiconductor storage device shown in FIG. 22 has a structure in which two memory chips 10 and 11 are stacked on the base substrate 20, and the base substrate 20 is mounted on a module substrate (not shown). Each of the memory chips 10 and 11 has a memory array MA, a command/address pad CAP to which commands and addresses are supplied, a chip select signal pad CSP to which a chip select signal is supplied, a data input/output pad DQP for inputting and outputting data, and a power pad VSP for supplying power.

The command/address pad CAP, data input/output pad DQP, and power pad VSP each have a shared connection with the memory chip 10 and memory chip 11, and are brought together in the command/address external terminal group CA, data input/output external terminal group DQ, and power supply external terminal group VS, respectively, on the base substrate 20. On the contrary, the chip select signal pad CSP does not share a connection, and the chip select signal pad CSP of the memory chip 10 is connected to the chip select signal external terminal CS0, and the chip select signal pad CSP of the memory chip 11 is connected to the chip select signal external terminal CS1. The purpose of this configuration is to allow the memory chips. 10 and 11 to be selectively activated.

Another method has recently been proposed whereby the core unit in which the memory cell is formed and the interface unit in which the peripheral circuit for the memory cell is formed are each placed in a separate chip, and higher storage capacity and higher speeds are made possible by stacking these chips. This means that semiconductor storage devices that are conventionally composed of a single chip are divided into a plurality of chips. This method therefore allows the capacity of the chip (core chip) in which the core unit is formed to be increased, and makes it possible to obtain a very large storage capacity by furthermore stacking the core chips.

However, since the semiconductor storage device shown in FIG. 22 is configured so that the command/address external terminal group CA and data input/output external terminal group DQ are connected to the memory chips 10 and 11, there is a problem in that the parasitic capacitance of the command/address external terminal group CA and the data input/output external terminal group DQ is considerable in comparison with ordinary semiconductor storage devices in which only a single chip has been packaged.

Since such parasitic capacitance is the cause of signal waveform disturbance, there is a possibility that an adequate operating margin cannot be assured when the interface speed is very high, that is, when the clock speed exceeds 1 GHz, for example. This problem makes it difficult to make the capacity sufficiently large by using the method shown in FIG. 22 because the problem is made more conspicuous as the number of memory chips to be stacked increases.

Also, since the semiconductor storage device shown in FIG. 22 is different from an ordinary semiconductor storage device in which only a single chip has been packaged in the sense that two chip select signal external terminals are provided (CS0, CS1) compatibility with ordinary semiconductor storage devices is therefore lost. For this reason, a special-purpose memory controller must be designed in order to use the semiconductor storage device shown in FIG. 22, and the overall cost of the system is liable to increase.

Using the method described in Japanese Patent Application Laid-Open No. 2004-327474 appears to be able to solve the above-described problems, but this configuration is fundamentally different from the type of semiconductor storage device in which memory chips that are capable of independently carrying out read and write operations are stacked, and is rather a configuration in which core chips that are not capable of independently carrying out read and write operations are stacked, as shown in FIG. 22.

Therefore, an ordinary memory chip naturally cannot be used and a special-purpose chip must be newly designed. Also, with the configuration described in Japanese Patent Application Laid-Open No. 2004-327474, a through-electrode must be formed in the chips, and other advanced manufacturing techniques that are not sufficiently established must be used. It is therefore believed that manufacturing such chips at low cost under current conditions is difficult.

SUMMARY OF THE INVENTION

The present invention was contrived in order to solve such problems, and an object of the present invention is to reduce the parasitic capacitance of the command/address external terminal group and the data input/output external terminal group to an amount that is equal to that of a single chip component in a semiconductor storage device having a plurality of stacked memory chips.

Another object of the present invention is to assure compatibility with ordinary semiconductor storage devices in which a single chip is packaged, in a semiconductor storage device having a plurality of stacked memory chips.

Yet another object of the present invention is to implement the objects described above with low cost by using memory chips that are each individually capable of read and write operations.

The above and other objects of the present invention can be accomplished by a semiconductor storage device comprising: a base substrate having a command/address external terminal group to which command signals and address signals are supplied, a data input/output external terminal group for inputting and outputting data signals, and a single chip select external terminal; and a plurality of memory chips that are stacked on the base substrate and are each individually capable of reading and writing operations, wherein a plurality of terminals constituting said command/address external terminal group, a plurality of terminals constituting said data input/output external terminal group, and said single chip select external terminal are connected to a single chip that has an interface function; and the single chip that has the interface function further has at least a chip select signal generation circuit that can individually activate said plurality of memory chips based on said address signals supplied via said command/address external terminal group and based on said chip select signal supplied via said chip select external terminal.

In accordance with the present invention, since the command/address external terminal group and other external terminals are connected to a single chip, the parasitic capacitance of the terminals can be reduced to an amount that is about equal to that of a single chip component. Also, since the semiconductor storage device of the present invention is provided with only a single chip select external terminal, it is possible to assure compatibility with ordinary semiconductor storage devices in which a single chip is packaged, even though the semiconductor storage device is provided with a plurality of stacked memory chips.

In addition, the stacked memory chips are memory chips that are individually capable of read and write operations. It is therefore possible to use so-called general-purpose memory, and hence to manufacture these chips at relatively low cost.

In the present invention, the single chip that has an interface function may be an interface chip that is different than the plurality of memory chips, or may be any one of the plurality of memory chips. With the former, it is possible to use the exact same chip as the memory chip that is used, and with the latter, it is possible to reduce the number of stacked chips by one.

The command signals, address signals, and data signals may be transmitted among the plurality of memory chips and the single chip that has an interface function by way of wiring with a shared connection to the plurality of memory chips, or may be carried out by way of wiring that is individually connected to the plurality of memory chips. The former allows the number of wires to be reduced, and the latter allows the wiring capacitance to be reduced.

Thus, in accordance with the present invention, it is possible to reduce the parasitic capacitance of the interface unit of a semiconductor storage device having a plurality of stacked memory chips to an amount equal to that of a single chip component. The input/output frequency of the command signal, address signal, and data signal can thereby be increased to that equivalent to a single chip component. Also, since the memory chips are three-dimensionally stacked in the present invention, the mounting surface area can be made equal to that of a single chip component.

Furthermore, since only a single chip select external terminal is provided, it is possible to assure compatibility with ordinary semiconductor storage devices in which a single chip is packaged. For this reason, there is no requirement that a special-purpose memory controller or the like be designed, and cost increases for the entire system can be held in check.

Since the stacked memory chips are furthermore ordinary memory chips (general-purpose DRAM, for example) that are each individually capable of read and write operations, formation of a through-electrode or other special steps are not required, and an increase in manufacturing costs can be inhibited.

Since it is also possible to individually activate the plurality of memory chips by using a chip select signal generation circuit, the power consumption of the entire package can also be reduced.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 8 is a list showing the commands and symbols that are output by the command decoder shown in FIG. 7, and the methods for issuing a chip select signal CS when the commands are executed;

DETAILED DESCRIPTION OF THE EMBODIMENTS

Preferred embodiments of the present invention will now be explained in detail with reference to the drawings.

Figure 1:
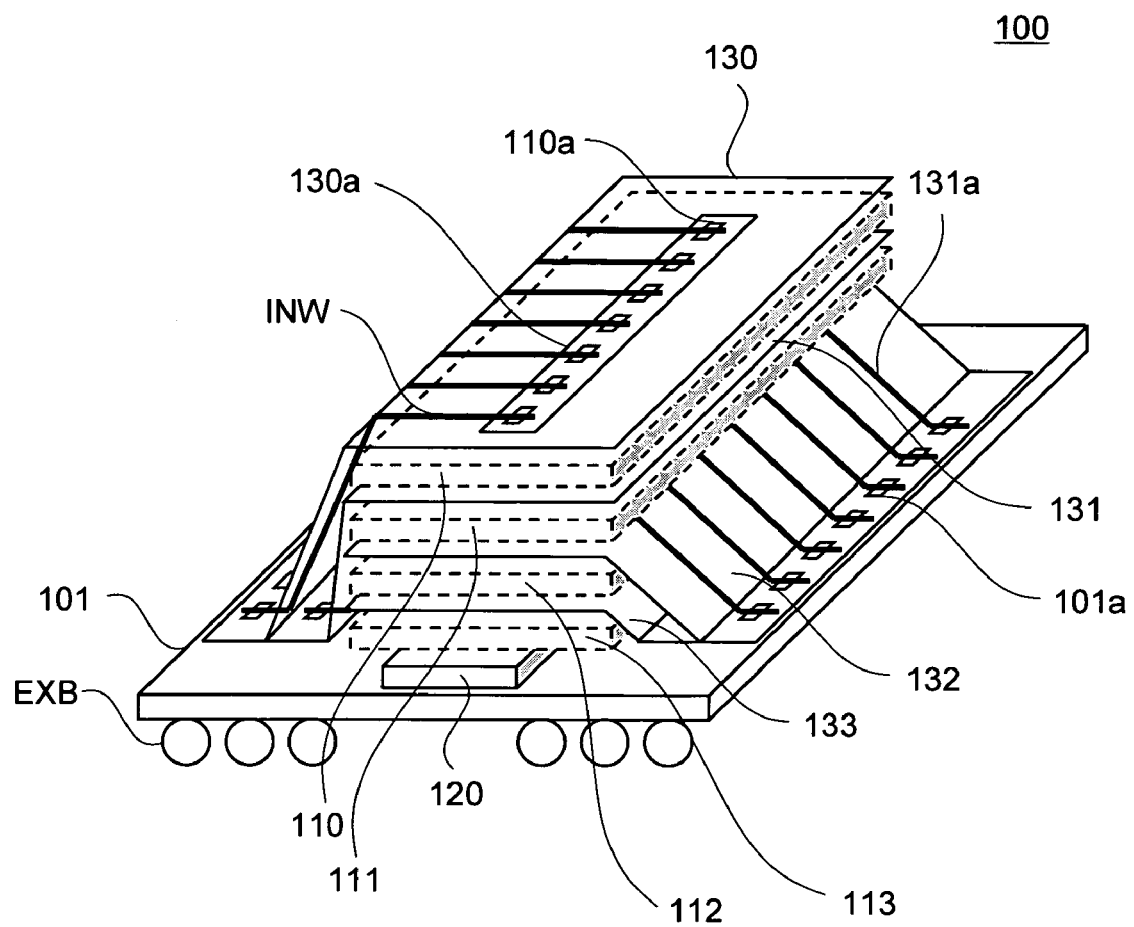
FIG. 1 is a simplified perspective view that schematically shows a structure of the semiconductor storage device according to the first embodiment of the present invention.

FIG. 1 is a simplified perspective view that schematically shows the structure of the semiconductor storage device 100 according to the first embodiment of the present invention.

The semiconductor storage device 100 of the present embodiment is provided with a base substrate 101, four memory chips 110 to 113 stacked on the base substrate 101, and an interface chip 120 disposed between the base substrate 101 and memory chips 110 to 113, as shown in FIG. 1. In the present embodiment, DRAM is selected as the memory chips 110 to 113, although this selection imposes no particular limitation. The memory chips 110 to 113 are chips having mutually the same configuration, and are DRAM chips that are individually capable of read and write operations, that is to say, the chips are ordinary general-purpose DRAM chips.

Figure 2:
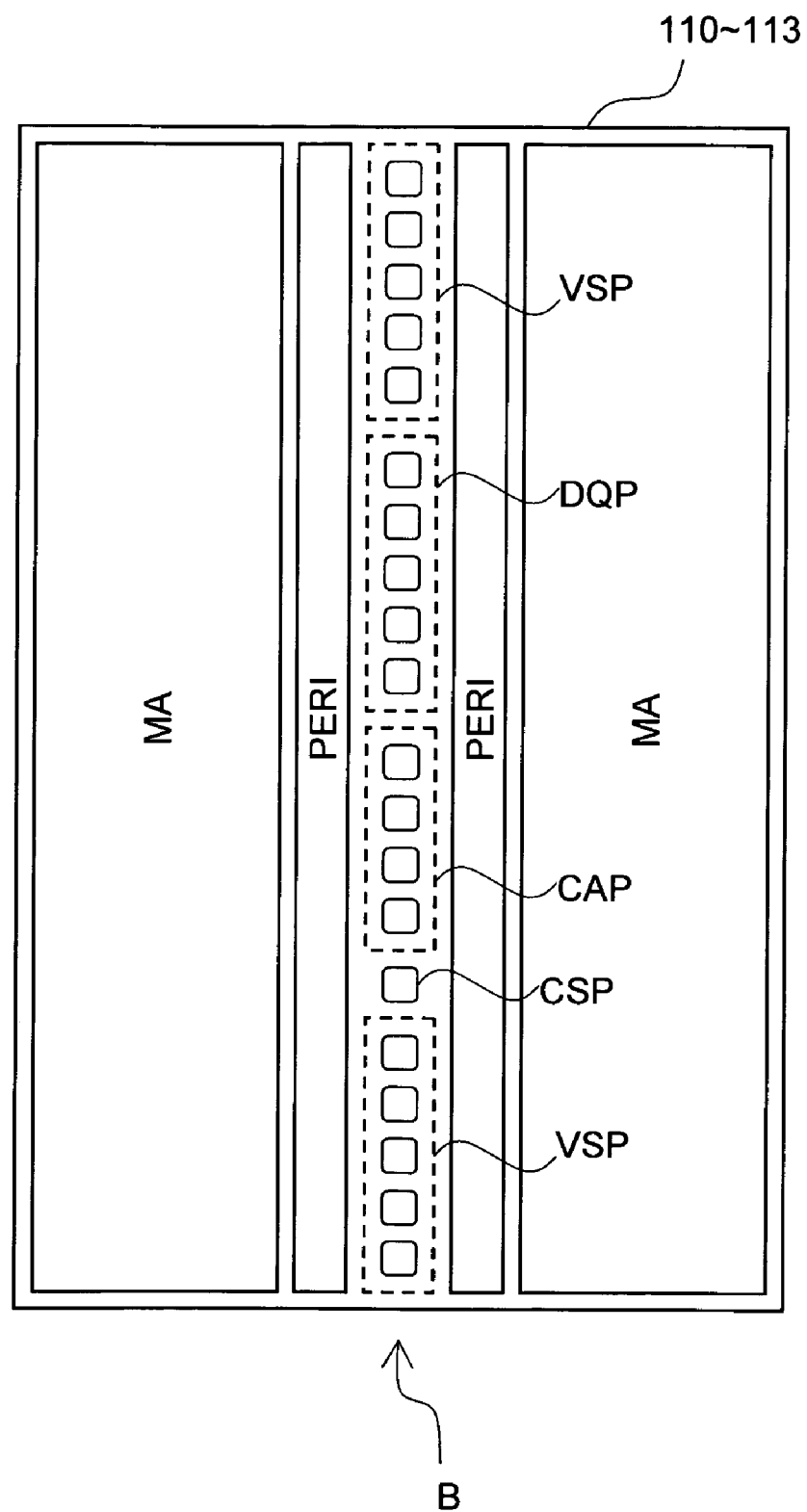
FIG. 2 is a simplified planar view of the memory chips shown in FIG. 1.

FIG. 2 is a simplified planar view of the memory chips 110 to 113.

The surface of the memory chips 110 to 113 can be largely classified into a memory array area MA, a peripheral circuit area PERI, and a bonding pad area B, as shown in FIG. 2. The bonding pad area B is disposed in a single direction in the center of the memory chip so as to be disposed between the two peripheral circuit areas PERI, and this area includes power supply pads VSP, a data input/output pad DQP, a command/address pad CAP, and a chip select signal pad CSP.

The power supply pads VSP have a peripheral circuit operating power supply VDD, a peripheral circuit ground power supply VSS, an output circuit operating power supply VDDQ, an output circuit ground power supply VSSQ, an interface reference power supply VREF, and the like. The data input/output pad DQP has data input/output pads DQ0 to DQ7 (the same applies to the case of ×8 components) a data strobe signal pad DQS, a data mask signal pad DM, and the like. The command/address pad CAP has a clock pad CLK, a clock enable pad CKE, a row address strobe pad RAS, a column address strobe pad CAS, a write enable pad WE, a bank address pads BA0 to BA2, an address pads A0 to A13, and the like.

The pads disposed on the memory chips 110 to 113 are connected to the pads 101a disposed on the base substrate 101 by way of tapes 130 to 133 on which wiring INW is formed, as shown in FIG. 1. More specifically, pads 110a disposed on the memory chip 110 and pads 101a disposed on the base substrate 101 are connected by tape 130 that is disposed so as to cover the memory chip 110, and pads disposed on the memory chips 111 to 113 and the pads 101a disposed on the base substrate 101 are similarly connected by tapes 131 to 133 that are disposed so as to cover the memory chips 111 to 113, respectively.

Wiring (not shown) is formed on the base substrate 101, and the pads 101a and the pads (not shown) on the memory chip side of interface chip 120 are connected by the wiring. Pads (not shown) on the external circuit side of the interface chip 120 are connected to ball electrodes EXB disposed on the reverse side (mounting side) of the base substrate 101 by way of other wiring (not shown) disposed on the base substrate 101. The ball electrodes EXB are external terminals of the semiconductor storage device 100 of the present embodiment.

Figure 3:
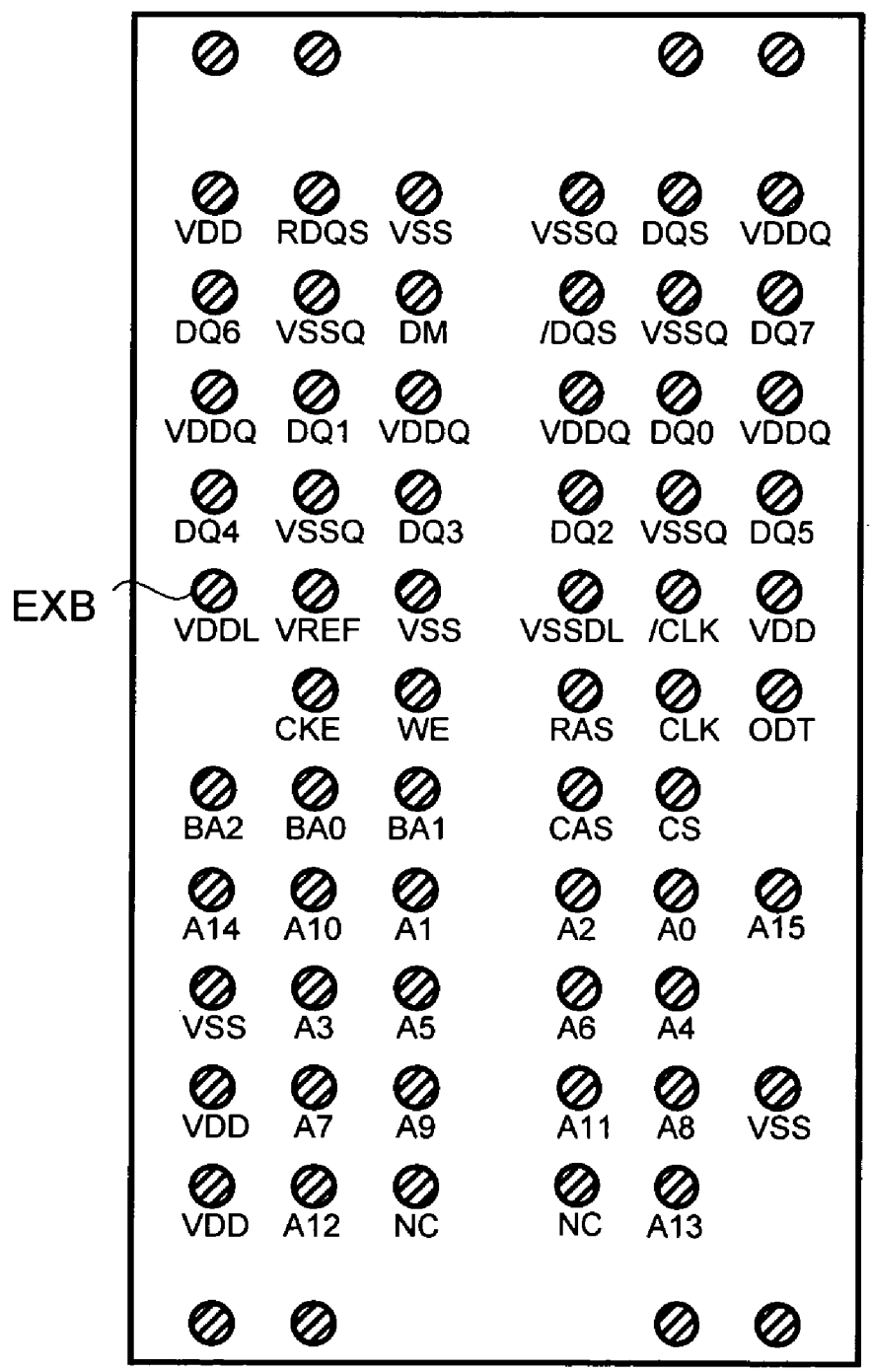
FIG. 3 is a layout drawing of ball electrodes disposed on the reverse side of the base substrate shown in FIG. 1.

FIG. 3 is a layout drawing of ball electrodes EXB disposed on the reverse side of the base substrate 101.

Other than the addition of address external terminals A14 and A15, the types of ball electrodes EXB (which is an external terminal group of the semiconductor storage device 100) match the types of pads disposed on the memory chips 110 to 113, as shown in FIG. 3. Therefore, the chip select signal external terminal CS is always a single terminal. The ball electrodes EXB can be classified into a power supply external terminal group (VS), a data input/output external terminal group (DQ), a command/address external terminal group (CA), and a chip select signal external terminal (CS).

The peripheral circuit operating power supply VDD, peripheral circuit ground power supply VSS, output circuit operating power supply VDDQ, output circuit ground power supply VSSQ, interface reference power supply VREF, and the like constitute the power external terminal group (VS) in the same manner as the pads disposed on the memory chips 110 to 113. The data input/output terminals DQ0 to DQ7, data strobe signal terminal DQS, data mask signal terminal DM, and the like constitute the data input/output external terminal group (DQ). The clock terminal CLK, clock enable terminal CKE, row address strobe terminal RAS, column address strobe terminal CAS, write enable terminal WE, bank address terminals BA0 to BA2, address terminals A0 to A13, and the like constitute the command/address external terminal group (CA).

Figure 4:
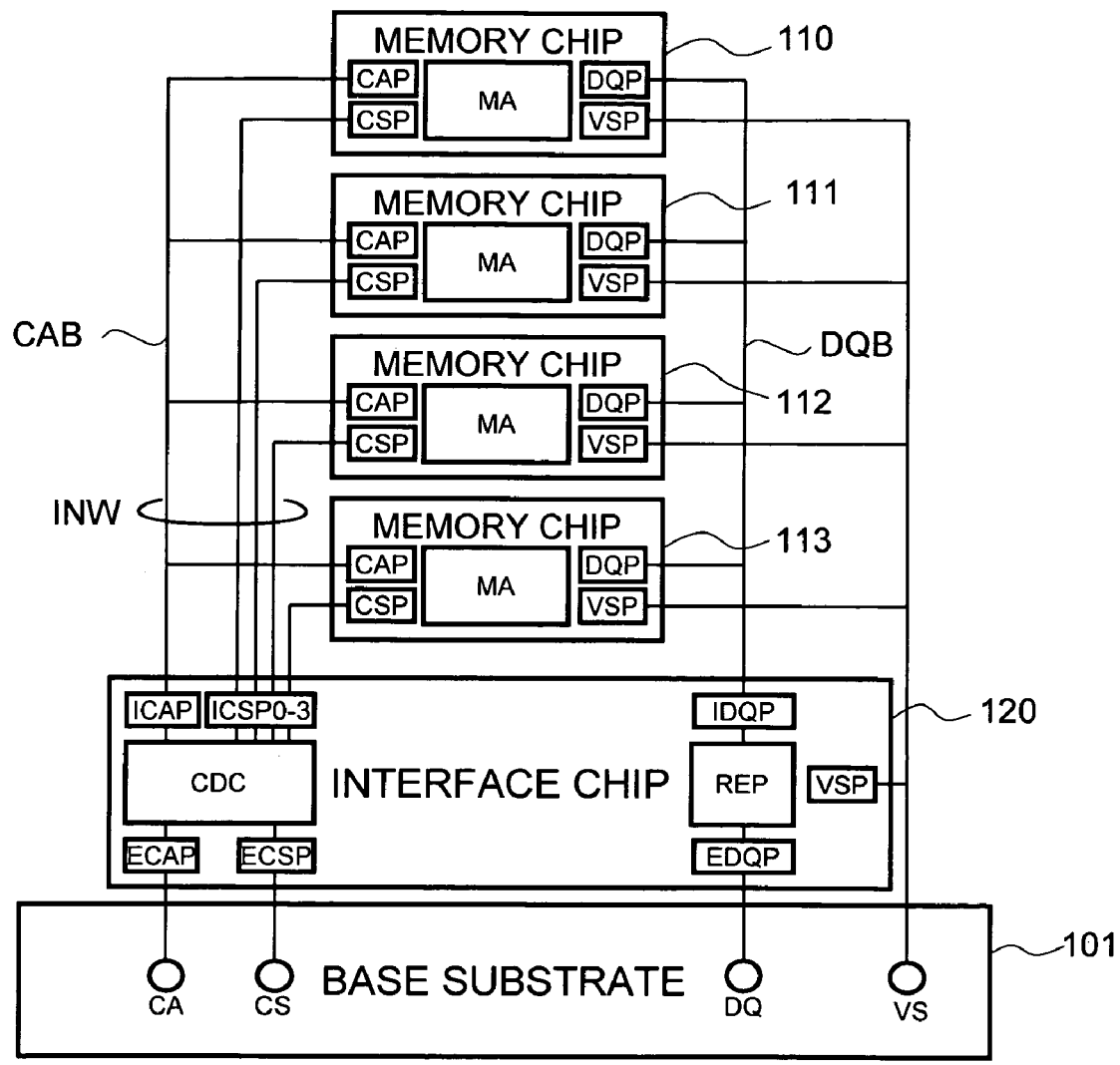
FIG. 4 is a schematic diagram that describes the connection configuration between the memory chips and the interface chip in the first embodiment.

FIG. 4 is a schematic diagram that describes the connection configuration between the memory chips 110 to 113 and the interface chip 120 in the present embodiment.

In the present embodiment, only the chip select signals are connected in a one-to-one relationship between the memory chips 110 to 113 and the interface chip 120, as shown in FIG. 4. The other signals, that is to say, the command/address signals and data signals, are bus-connected by the command/address bus CAB and the data bus DQB. The power supply is also bus-connected.

As used herein, the term "one-to-one connection" refers to a connection in which the pads of the memory chips 110 to 113 and the pads of the interface chip 120 are individually connected for each memory chip, and the term "bus-connected" refers to a connection in which the pads of the memory chips 110 to 113 and the pads of the interface chip 120 share connections. Therefore, in the present embodiment, in the set of signals transmitted between the memory chips 110 to 113 and the interface chip 120, only the chip select signal is a signal that is individually provided to the memory chips 110 to 113.

Described more specifically, the command/address external terminal group CA and the chip select signal external terminal CS are connected to the command/address pad ECAP and the chip select signal pad ECSP, respectively, on the interface chip 120 by way of the ball electrodes EXB on the base substrate 101. These signals are supplied to the command decoder CDC, and the output signals of the decoder are supplied to the command/address pad ICAP and chip select signal pad ICSP, respectively.

The signals (commands and addresses) that are output to the command/address pad ICAP are supplied in a shared configuration to the command/address pads CAP of the four memory chips 110 to 113 by way of the command/address bus CAB. On the other hand, four chip select signals that are output to the chip select signal pad ICSP are connected in a one-to-one relationship between the interface chip 120 and each of the memory chips 110 to 113.

The data input/output external terminal group DQ is connected once to the data input/output pad EDQP on the interface chip 120 by way of the ball electrodes EXB on the base substrate 101. The data input/output signals are input to a bidirectional repeater REP, and are connected to the data input/output pads DQP of the memory chips 110 to 113 by way of the data input/output pad IDQP. The data input/output pad IDQP and the data input/output pads DQP of the four memory chips. 110 to 113 are connected by a data bus DQB in the form of a 1:4 bus.

The power supply external terminal group VS is connected to the power supply pads VSP of the memory chips 110 to 113 and to the interface chip 120 directly by way of the ball electrodes EXB on the base substrate 101.

Thus, in the semiconductor storage device 100 of the present embodiment, the connections between the ball electrodes EXB on the base substrate 101 and the memory chips 110 to 113 (excluding the power supply) are all carried out by way of the interface chip 120. The chip connected to the data input/output external terminal group DQ and the command/address external terminal group CA is only the interface chip 120. Thus, the parasitic capacitance of the external terminals can be reduced to an amount equal to that of a single chip component, and the frequency of the command/address and data input/output can be increased to a level equivalent to that of a single chip component.

In the present embodiment, since the command/address signals and data input/output signals are connected in the form of a bus inside a package, the number of wires inside the package can be kept low and manufacturing costs can thereby be held in check.

Figure 5:
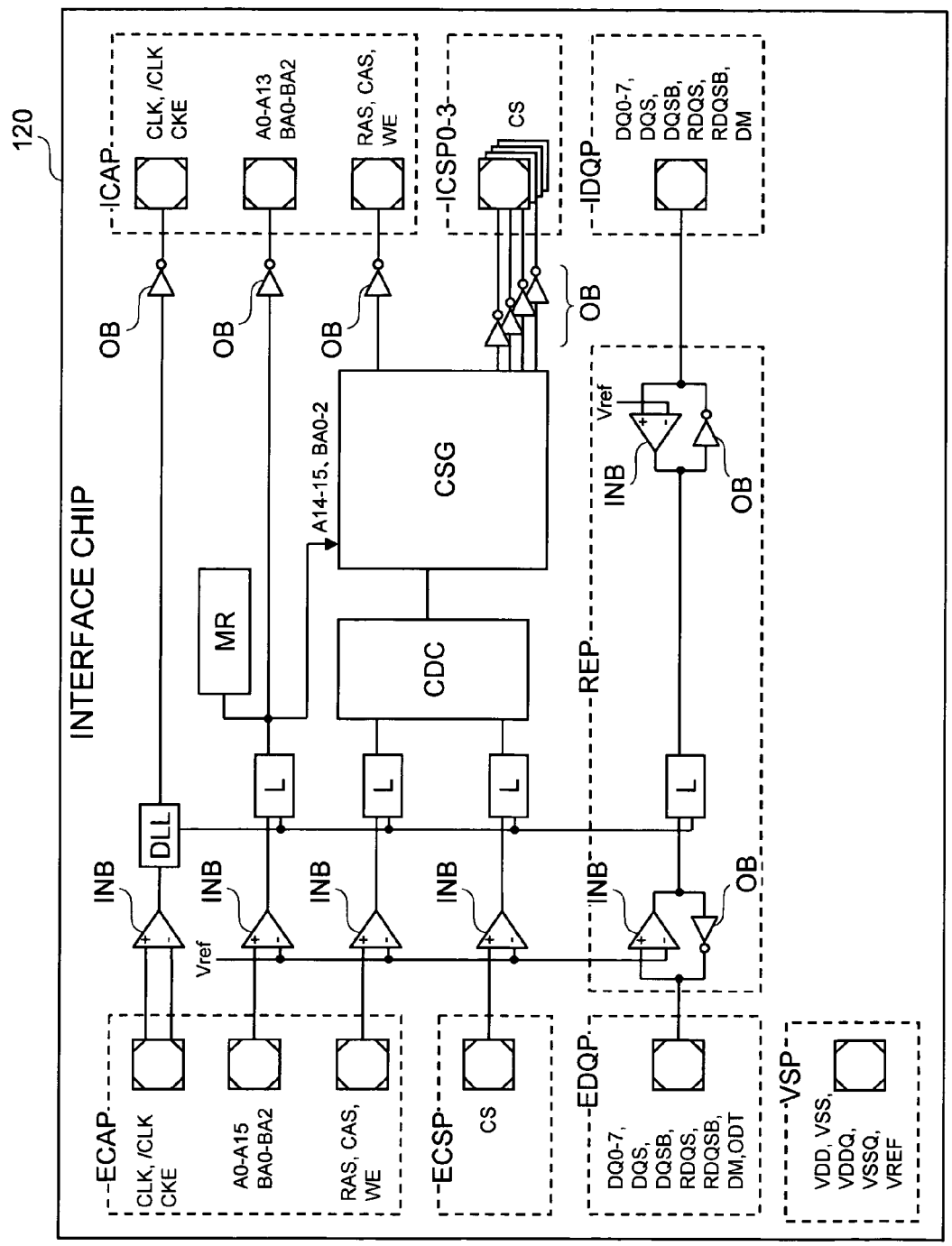
FIG. 5 is a simplified circuit diagram showing the circuit configuration of the interface chip used in the first embodiment.

FIG. 5 is a simplified circuit diagram showing the circuit configuration of the interface chip 120 used in the present embodiment.

The command/address pad ECAP on the interface chip 120 has pads for three systems: the clock system signals CLK, /CLK, and CKE; address system signals A0 to A-15 and BA0 to BA2; and command system signals RAS, CAS, and WE, as shown in FIG. 5. The clock system signals CLK, /CLK, and CKE are supplied from outside of the semiconductor storage device 100 and are supplied to a clock regeneration circuit DLL by way of an input buffer INB. The output of the clock regeneration circuit DLL is supplied to terminals that output, respectively, the clock signals CLK, /CLK, and CKE of the command/address pad ICAP by way of the output buffer OB. The output of the clock regeneration circuit DLL is distributed within the interface chip 120 in order to latch other input signals in the latch circuits L.

The address system signals A0 to A15 and BA0 to BA2 are latched in the latch circuits L by way of the input buffers INB. The timing signals of the latch circuits L are supplied by the clock regeneration circuit DLL described above. The output of the latch circuits L is supplied to the terminals that output the address signals A0 to A13 and BA0 to BA2 of the command/address pad ICAP by way of the output buffer OB.

Here, the address signals A0 to A13 and BA0 to BA2 of the address signals A0 to A15 and BA0 to BA2 that are supplied from the exterior are directly fed to the command/address pad ICAP. The address signals A14 and A15 are not supplied to the command/address pad ICAP, but are rather fed to the chip select signal generation circuit CSG together with the output of the mode register MR and the bank addresses BA0 to BA2. The chip select signal generation circuit CSG is a circuit that activates any or all of the four chip select signal terminals CS supplied to the memory chips 110 to 113.

The command system signals RAS, CAS, and WE are supplied to the command decoder CDC by way of the input buffers INB and latch circuits L. The output of the command decoder CDC is supplied to the chip select signal generation circuit CSG. The exact same signals as those fed to a general-purpose DRAM can be used as the command system signals RAS, CAS, and WE.

The chip select signal pad ECSP on the interface chip 120 is a single pad as described above. Therefore, the same chip select signal CS as used in a general-purpose DRAM may be supplied from outside of the semiconductor storage device 100 without consideration for the number of (four) stacked layers of memory chips 110 to 113. The chip select signal CS supplied to the chip select signal pad ECSP is input to the command decoder CDC by way of the input buffer INB and latch circuits L. As described above, the chip select signal generation circuit CSG activates any or all of the four chip select signals CS on the basis of the address signals A14 and A15, the bank addresses BA0 to BA2, and the output of the command decoder CDC.

The data input/output pad EDQP on the interface chip 120 is a terminal for inputting and outputting the data signals DQ0 to DQ7, data strobe signal DQS, data mask signal DM, and other signals, and is connected to the data input/output pad IDQP by way of the bidirectional repeater REP, as described above.

In this case, when the memory chips 110 to 113 to be stacked are the double data rate (DDR-800) type, a signal with speed of 400 Mbps is transferred over the command/address external terminal group CA and the command/address bus CAB inside the package. On the other hand, a signal with speed of 800 Mbps is transferred over the on the data input/output external terminal group DQ and the data bus DQB inside the package.

Described next in greater detail is the circuit configuration of the interface chip 120 used in the present embodiment.

Figure 6:
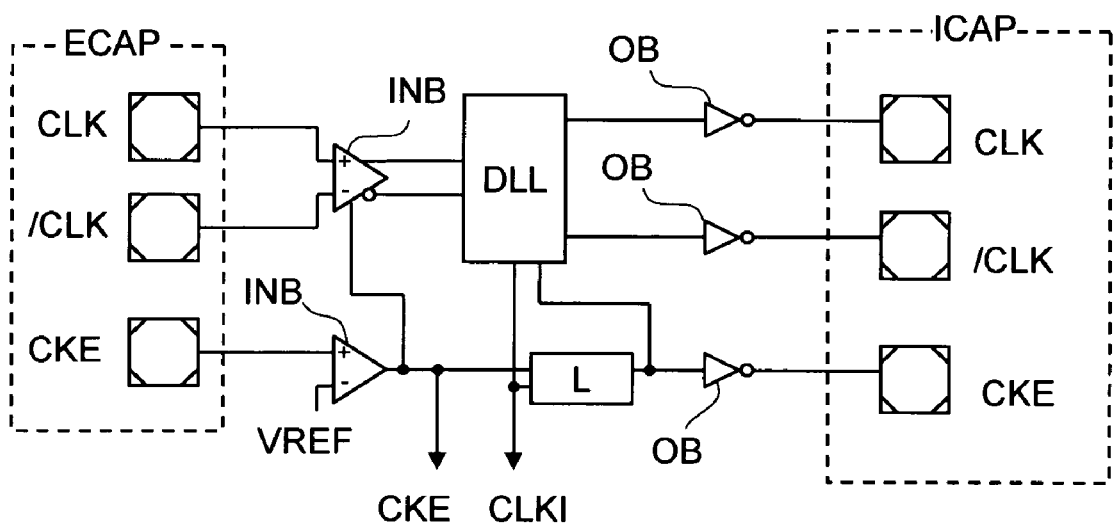
FIG. 6 is a diagram showing in greater detail the circuit configuration of the clock system circuitry contained in the interface chip shown in FIG. 5.

FIG. 6 is a diagram showing in greater detail the circuit configuration of the clock system circuitry contained in the interface chip 120.

The complimentary clock signals CLK and /CLK supplied from the command/address pad ECAP are input to a differential amp input buffer INB, as shown in FIG. 6. The input buffer INB is activated by the output of the differential amp input buffer INB that receives the clock enable signal CKE and the reference voltage VREF. The output of the input buffer INB that receives the complimentary clock signals CLK and /CLK is supplied to the clock regeneration circuit DLL, and the output of the regeneration circuit is supplied to the complimentary clock signals CLK and /CLK of the command/address pad ICAP by way of the output buffers OB. The clock regeneration circuit DLL generates an internal clock signal CLKI, and the internal clock signal CLKI is supplied to the internal circuitry of the interface chip 120.

The output of the input buffer INB that receives the clock enable signal CKE is latched by the latch circuit L (which uses internal clock signal CLKI as a timing signal), and is supplied to the clock enable terminal CKE of the command/address pad ICAP by way of the output buffer OB. The clock enable signal CKE buffered by the input buffer INB is also supplied to the internal circuitry of interface chip 120. The clockenable signal CKE is fed to the clock regeneration circuit DLL, and when the clock enable signal CKE is activated, the clock feed to the memory chips 110 to 113 is stopped.

Thus, in this present embodiment, since a clock regeneration circuit DLL is provided inside the interface chip 120, the phase difference between the input and output clocks is reduced and the timing margin of the latch circuits L is increased. The operating margin can therefore be adequately assured even when the operating frequency is higher. When the clock enable signal CKE is deactivated, the operation of the clock regeneration circuit DLL is stopped, and since the clock feed to the memory chips 110 to 113 and the internal circuitry of the interface chip 120 is stopped, the power consumption during standby can be reduced.

Figure 7:
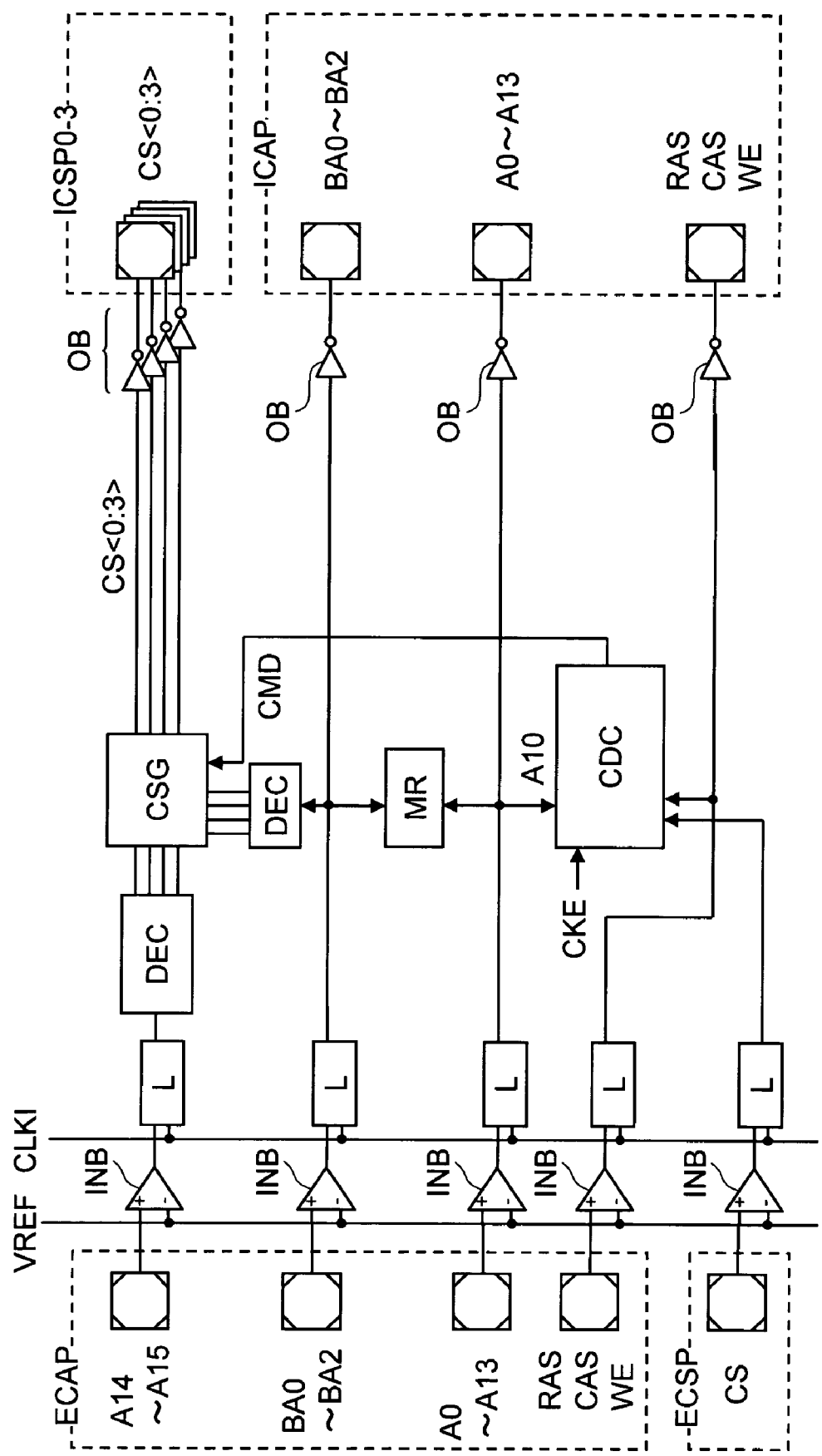
FIG. 7 is a diagram showing in greater detail the circuit configuration of the command/address system circuitry contained in the interface chip shown in FIG. 5.

FIG. 7 is a diagram showing in greater detail the circuit configuration of the command/address system circuitry contained in the interface chip 120.

The command/address system signals A0 to A15, BA0 to BA2, RAS, CAS, and WE are input from outside of the semiconductor storage device 100 to input buffers INB by way of the command/address pad ECAP, as shown in FIG. 7.

The chip select signal CS is supplied from outside of the semiconductor storage device 100 to an input buffer INB by way of the chip select signal pad ECSP. The input buffers INB are differential amp input buffers in which the reference voltage VREF is used, and the outputs of the buffers are supplied to corresponding latch circuits L. The latch circuits L synchronize with the internal clock signal CLKI generated by the clock regeneration circuit DLL (refer to FIG. 6), and accept the output of the corresponding input buffer INB.

The address signals A14 and A15 of the address signals A0 to A15 are decoded in the decoder DEC, and decoder output is supplied to the chip select signal generation circuit CSG. The bank addresses BA0 to BA2 are supplied to the command/address pad ICAP and are also supplied to the chip select signal generation circuit CSG and the mode register MR. The address signals A0 to A13 are supplied to the command/address pad ICAP and are also supplied to the mode register MR. The address signal A10 of the address signals A0 to A13 is also supplied to the command decoder CDC together with the command system signals RAS, CAS, and WE, as well as the chip select signal CS and clock enable signal CKE. The command decoder CDC decodes the signals in the same manner as a general-purpose DRAM, and generates a command signal CMD on the basis of the decoding result.

The command system signals RAS, CAS, and WE are directly supplied to the command/address pad ICAP, and an activate command (Bank activate), read command (Read) write command (Write), precharge command (Precharge), refresh command (Refresh), and other commands are presented to the memory chips 110 to 113.

The chip select signal generation circuit CSG receives a command signal CMD fed by the command decoder CDC and determines the operating mode. Any or all of the four chip select signals CS0 to CS3 are activated based on the operating mode thus determined. The chip select signals CS0 to CS3 are supplied to the corresponding chip select signal pads ICSP, respectively, by way of output buffers OB.

Thus, in the present embodiment, since the higher bits A14 and A15 of the address signals are decoded and the chip select signals CS0 to CS3 are activated based on the decoded signals, the memory chip appears from outside of the semiconductor storage device 100 as a single, large memory chip, and only one of the four memory chips 110 to 113 is activated in ordinary operation inside the semiconductor storage device 100. For this reason, an increase in power consumption can be held in check while assuring compatibility with general-purpose DRAM.

FIG. 8 is a list showing the commands and symbols that are output by the command decoder CDC, and the methods for issuing a chip select signal CS when the commands are executed.

Commands are input to the command decoder CDC by using the clock system signal CKE, chip select signal CS, address signal A10, and command system signals RAS, CAS, and WE fed from outside the semiconductor storage device 100, and the command decoder CDC generates a command signal CMD by using a combination of the signals. The chip select signal generation circuit CSG that receives the command signal CMD activates the chip select signals CS0 to CS3 as described below in accordance with the type of command.

First, when a mode set command "Mode register set (MRS)" or "Extended mode register set (EMRS)" classified as an "Initialization" command has been input, all the chip select signals CS0 to CS3 are simultaneously activated.

Figure 9:
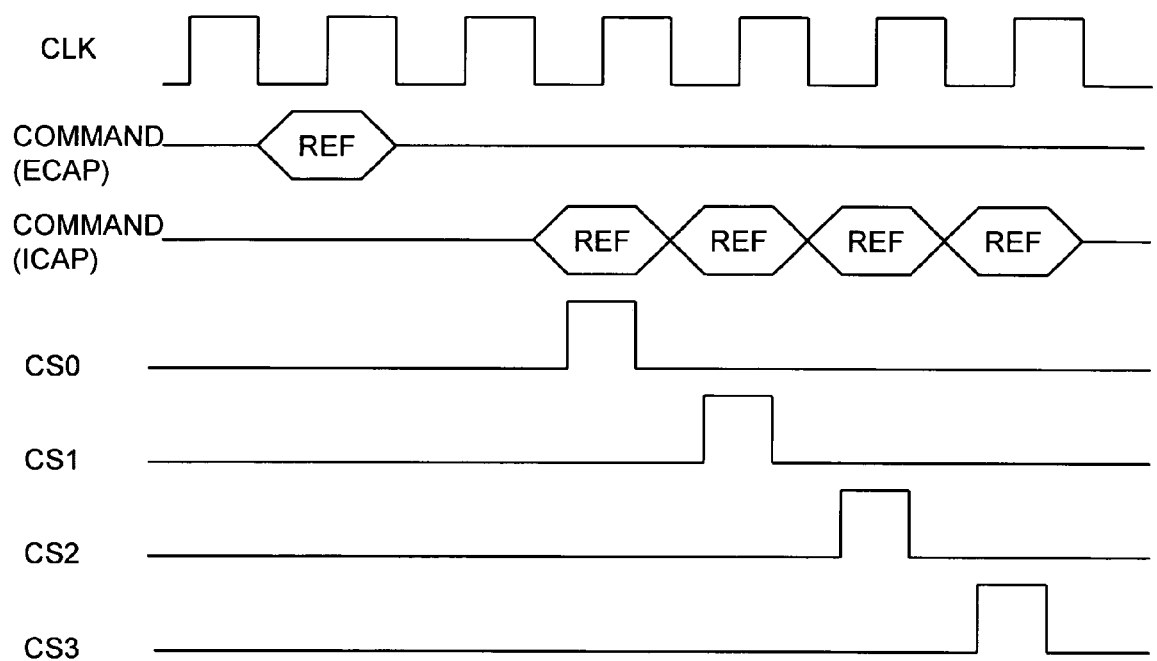
FIG. 9 is a timing chart showing the issue timing of the refresh command to each memory chip.

When a refresh command "Auto refresh (REF)" or "Self refresh entry (SELF)" classified as a "Row system" command has been input, the chip select signals CS0 to CS3 are sequentially activated with a phase difference. In other words, when synchronization is made with the clock signal CLK from outside the semiconductor storage device 100 and a refresh command (REF or SELF) is input, the interface chip 120 continuously issues a refresh command (REF or SELF) to the memory chips 110 to 113 by way of the command/address pad ICAP, and sequentially activates the chip select signals CS0 to CS3, as shown in FIG. 9.

The same refresh command (REF or SELF) is thereby sequentially input with a prescribed phase difference to the four memory chips 110 to 113. The phase difference is a single clock cycle as shown in the example of FIG. 9, but no limitation is imposed thereby, and the phase difference may be a plurality of clock cycles.

Thus, the reason that refresh commands (REF or SELF) are sequentially issued with a phase difference to the memory chips 110 to 113 is that a greater amount of electric current temporarily flows during a refresh operation than during ordinary read and write operations. In other words, when refresh commands (REF and SELF) are simultaneously issued to all the memory chips 110 to 113, the four memory chips 110 to 113 are simultaneously refreshed. As a result, a considerable amount of electric current flows, and the power supply potential and ground potential are liable to fluctuate.

In the case that return from self refresh is instructed, that is to say, in the case that a "Self refresh exit (SELFX)" command has been issued, all of the chip select signals CS0 to CS3 are simultaneously activated. Inputting a precharge command "Single bank precharge (PRE)" or "Precharge all banks (PALL)" activates the chip select signals CS0 to CS3, which correspond to the chip numbers (#0 to #3) stored in the active bank register ABR.

Figure 10A:
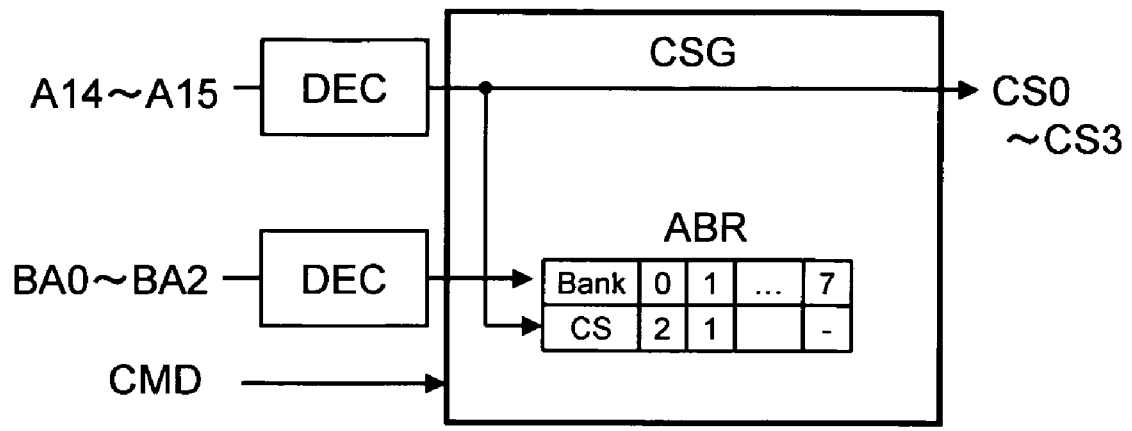
FIG. 10A is a diagram for describing the function of the active bank register in the case where an activation command is issued.

When an activation command "Back activate (ACT)" has been input, any one of the chip select signals CS0 to CS3 is activated based on the address signals A14 and A15, and the relationship between the activated chip select signal (CS0 to CS3) and the selected bank number (#0 to #7) is stored in the active bank register ABR shown in FIG. 10A. The active bank register ABR is a circuit disposed inside the chip select signal generation circuit CSG, and this register is made up of a group of registers that hold the relationship between the chip numbers (#0 to #3) specified by the higher two bits A14 and A15 of the row address, and the bank numbers (#0 to #7) specified by the bank addresses BA0 to BA2.

The reason for providing such an active bank register ABR is that since chip selection is carried out by the higher bits A14 and A15 of the row address A0 to A15 and only the bank address BA0 to BA2 and the column address A0 to A9 are fed when a column system command is input, it cannot be determined which chip select signals CS0 to CS3 should be activated when a column system command has been input if the above-described relationship is not stored using the active bank register ABR. However, provided that the bank address is expanded to five bits (BA0 to BA4) in lieu of the row address A14 and A15, that the chip is selected by using the higher two bits (BA0 and BA1), and that the bank inside the chip selected by the lower three bits (BA2 to BA4) is selected, such a problem is solved because the relationship between the bank address and the chip to be selected is fixed.

Nevertheless, in order to maintain compatibility with common general-purpose DRAM having an 8-bank configuration, the bank address is preferably given a three-bit configuration (BA0 to BA2) and a portion (A14 and A15) of the row address is used rather than the bank address to select a chip, as in the present embodiment. It is for this reason that an active bank register ABR is provided in the present embodiment.

Figure 10B:
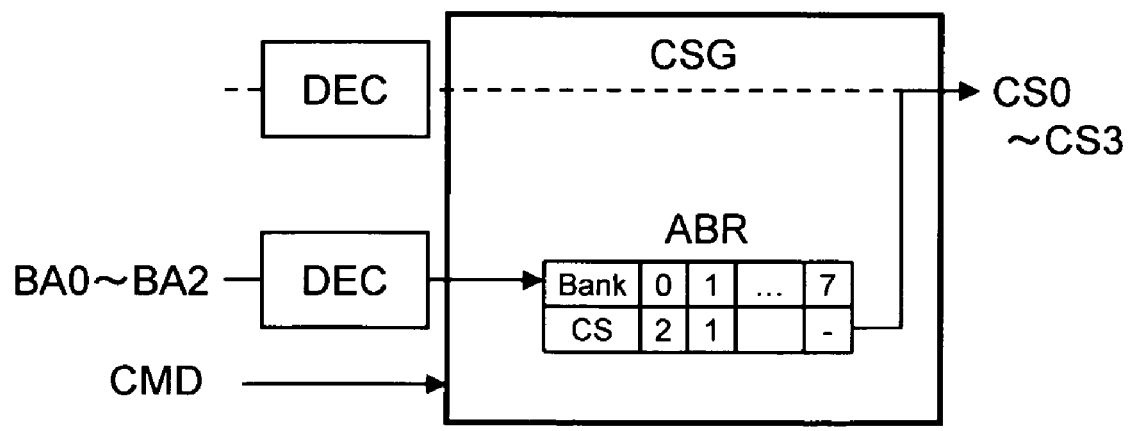
FIG. 10B is a diagram for describing the function of the active bank register in the case where a column system command is issued.

When a write command "Write (WRIT)" or "Write with auto precharge (WRITA)" classified as a "column system" command, or a read command "Read (READ)" or "Read with auto precharge (READA)" classified as a "column system" command has been input, the bank address BA0 to BA2 is decoded in the decoder DEC, as shown in FIG. 10B, and the chip select signals CS0 to CS3, which correspond to the chip numbers (#0 to #3) stored in the active bank register ABR, are activated.

When a "No operation (NOP)" command, "Device deselect (DESL)" command, "Power down mode entry (PDEN)" command, or "Power down mode exit (PDEX)" command classified as "another" command has been input, all of the chip select signals CS0 to CS3 are simultaneously activated.

Thus, in the present embodiment, since the chip number to be activated is stored in the active bank register ABR when an activation command "Bank activate (ACT)" has been input, data can be accessed from outside the semiconductor storage device 100 by inputting to the interface chip 120 only the bank address BA0 to BA2 and the column address A0 to A9 when a read command or write command is input.

The same address input method as that used for a general-purpose DRAM can therefore be used and compatibility can be assured. Since commands are issued with a phase difference to the memory chips 110 to 113 when a refresh operation is carried out, the peak electric current that flows at the instant the memory chips 110 to 113 carry out a refresh operation can be staggered and power supply noise can be reduced.

Figure 11:
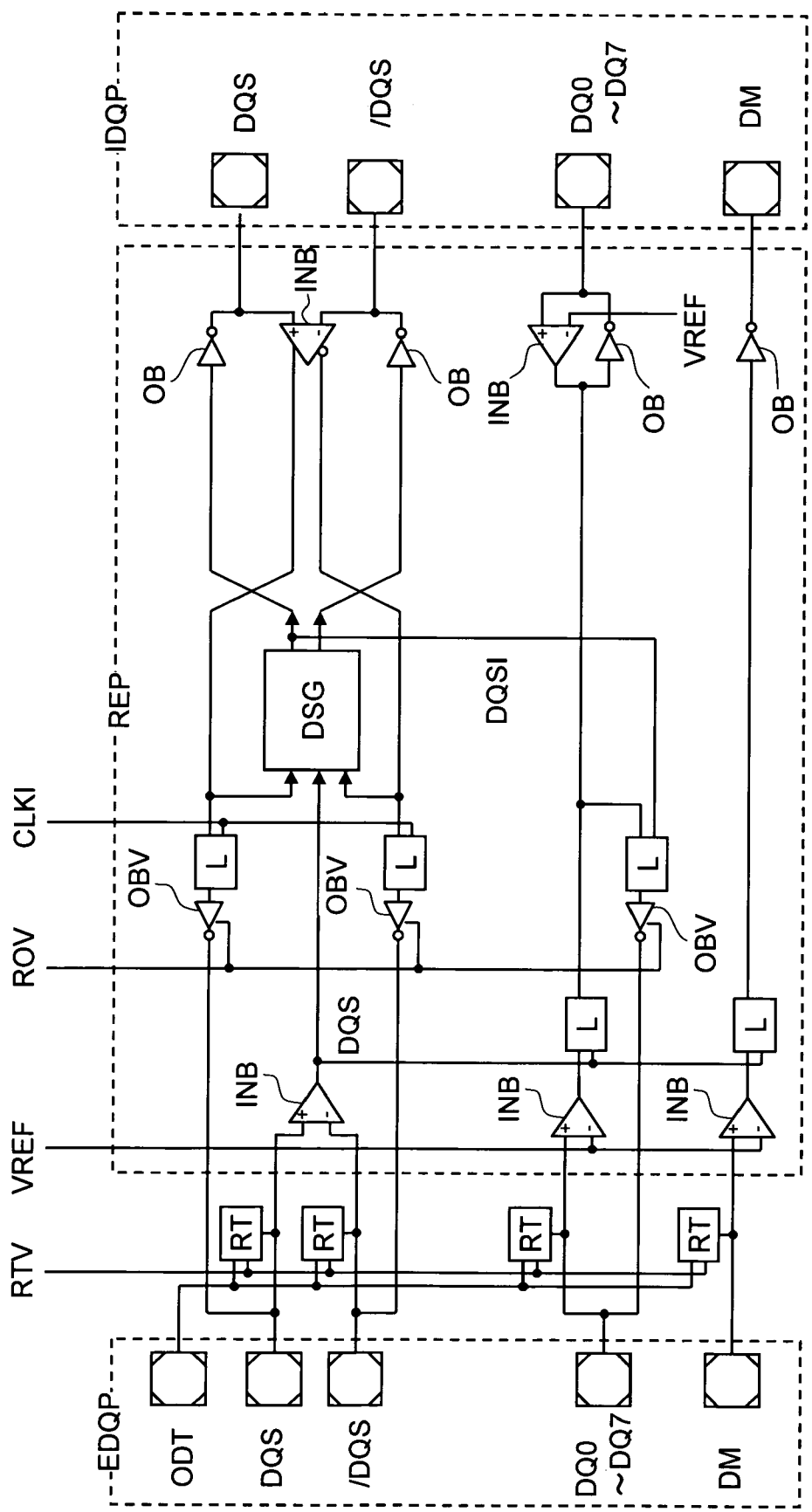
FIG. 11 is a diagram showing in greater detail the circuit configuration of the principal components of the data system circuitry contained in the interface chip shown in FIG. 5.

FIG. 11 is a diagram showing in greater detail the circuit configuration of the principal components of the data system circuitry contained in the interface chip 120. In FIG. 11, the RDQS and /RDQS included in the signals of the data system are omitted.

The data system signals ODT, DQS, /DQS, DQ0 to DQ7, and DM are supplied from outside the semiconductor storage device 100 by way of the data input/output pad EDQP, as shown in FIG. 11. The on-chip resistance activation signal ODT is supplied to terminating resistors RT connected to the terminals, and the resistance value data RTV issued by the mode register is supplied to the terminating resistors RT in a shared configuration.

The data system signals have a higher frequency than the command/address system signals, and the signal waveform is therefore more easily distorted, but signal reflection can be reduced by carrying out termination inside the chip without any terminating resistance on the substrate. The distortion of the signal waveform can thereby be inhibited, resulting in an increased operating margin. In an ordinary DRAM, a terminating resistance is used inside the memory chip, but in the semiconductor storage device 100 of the present embodiment, a terminating resistance is used inside the interface chip 120.

The data system signals DQS, /DQS, DQ0 to DQ7, and DM are supplied to the data input/output pad IDQP by way of a bidirectional repeater REP. More specifically, the data signals DQ0 to DQ7 and DM that are input from outside the semiconductor storage device 100 during a write operation are amplified by differential input buffers INB that make a comparison with the reference voltage VREF and are latched in the latch circuits L. The data strobe signals DQS and /DQS input from outside the semiconductor storage device 100 during a write operation are amplified by differential input buffers INB. When signals are output to the memory chips 110 to 113, an internal strobe signal DQSI that is offset in phase by 90° with respect to the data signals DQ0 to DQ7 is applied. The internal strobe signal DQSI is generated by a strobe signal generation circuit DSG.

Figure 12:
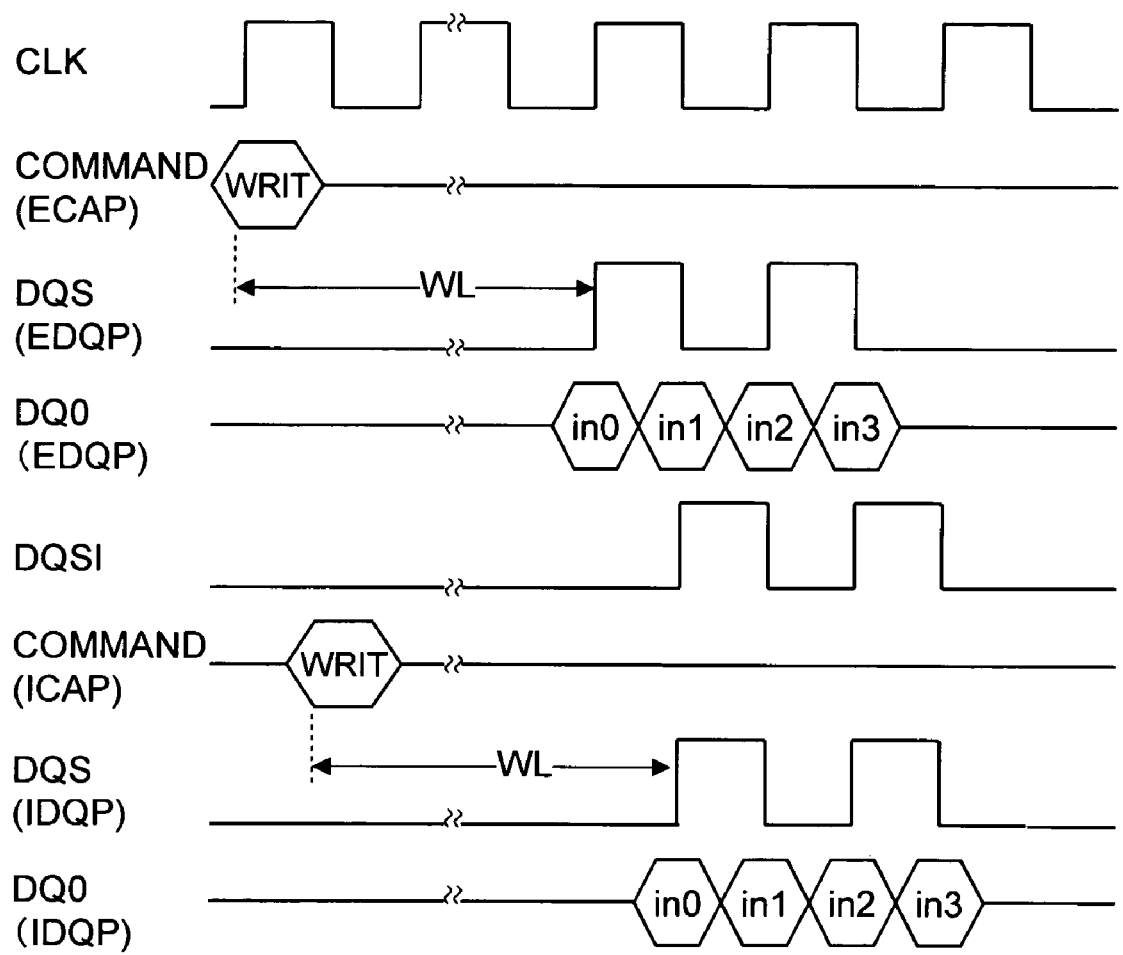
FIG. 12 is a timing chart showing the write operation of the semiconductor storage device according to the first embodiment.

Therefore, the data strobe signal DQS on the data input/output pad EDQP is offset in phase by 90° with respect to the data in0, in1, in2, and in3 that are continuously input during a write operation, as shown in FIG. 12. Accordingly, the latch circuits L synchronize with the rise and fall of the data strobe signal DQS, and the data in0, in1, in2, and in3 can be sequentially received. Also, the data in0, in1, in2, and in3 sequentially received in this manner synchronize with the data strobe signal DQS on the data input/output pad IDQP, and are output to the memory chips 110 to 113 selected the chip select signals CS0 to CS3.

More specifically, synchronization is made with the rising edge of the clock signal CLK during a write operation, as shown in FIG. 12; a write command (WRIT) is input to the command/address pad ECAP; and after a prescribed write latency WL has elapsed, the data signals DQ0 to DQ7 are input to the data input/output pad EDQP. Only a single data DQ0 of the data signals DQ0 to DQ7 is shown in FIG. 12. The data strobe signal DQS (which is offset in phase by 90°) is also input to the data input/output pad EDQP simultaneously with the data signals DQ0 to DQ7 to be written.

A write command (WRIT) is supplied to the interface chip 120, after which synchronization is made with the subsequent falling clock signal CLK, and the same command (WRIT) is output to the memory chips 110 to 113 by way of the command/address pad ICAP. The data signals DQ0 to DQ7 and data strobe signal DQS are also output from the data input/output pad IDQP after a prescribed write latency WL has elapsed. The write latency WL is a value that is set in advance in the mode register on the memory chips 110 to 113 and on the interface chip 120. In the case of a write operation, the write latency WL is set to the same value in the interface chip 120 and the memory chips 110 to 113.

The data signals DQ0 to DQ7 output from the memory chips 110 to 113 during a read operation synchronize with the internal strobe signal DQSI that is generated by the strobe signal generation circuit DSG inside the interface chip 120, are received by the latch circuits L, and are output to the outside of the semiconductor storage device 100. Since the data strobe signal DQS fed from the memory chips 110 to 113 during a read operation match the phase of the data signals DQ0 to DQ7, as shown in FIG. 13, the data signals DQ0 to DQ7 cannot be directly received in synchronization with the data strobe signal DQS.

In view of the above, an internal strobe signal DQSI that is offset in phase by 90° from the data strobe signal DQS is generated by the strobe signal generation circuit DSG, and the read data is received in synchronization with the internal strobe signal. The data signals DQ0 to DQ7 thus received are synchronized with the internal clock signal CLKI (not shown) and output to an impedance variable output buffer OBV. The impedance of the impedance variable output buffer OBV is controlled by the impedance setting value ROV issued from the mode register MR.

Figure 13:
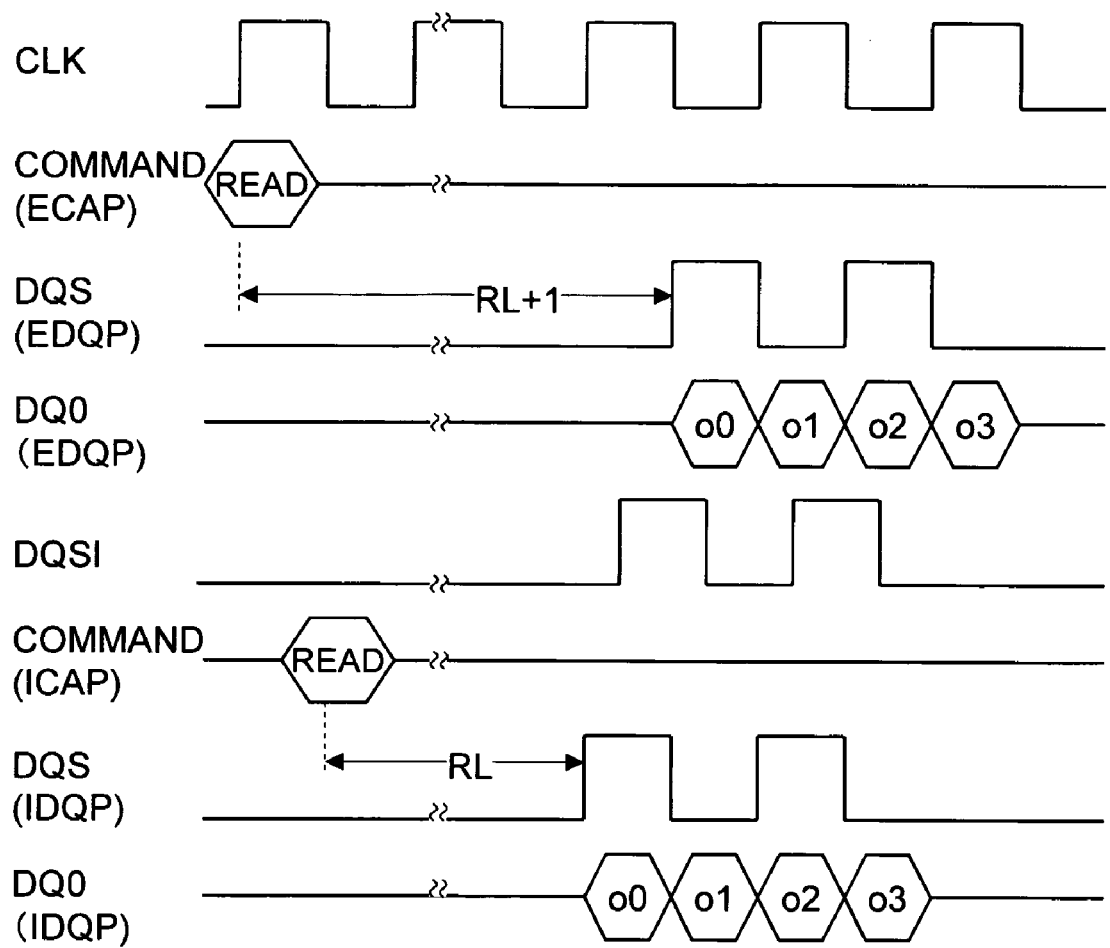
FIG. 13 is a timing chart showing the read operation of the semiconductor storage device according to the first embodiment.

More specifically, the read command (READ) is input to the command/address pad ECAP of the interface chip 120 at the rising edge of the clock signal CLK during a read operation, as shown in FIG. 13. The read command (READ) is thereafter output to the memory chips 110 to 113 at the subsequent falling edge of the clock signal CLK by way of the command/address pad ICAP. After a prescribed read latency RL has elapsed, data signals DQ0 to DQ7 and DQS are output from the memory chips 110 to 113.

The interface chip 120 receives the data signals by way of the data input/output pad IDQP, synchronizes the signals with the subsequent clock signal CLK, and outputs the signals to the outside of the semiconductor storage device 100 by way of the data input/output pad EDQP. Since the data strobe signal DQS matches the phase of the data signals DQ0 to DQ7 during a read operation, the signal is directly matched with the clock and is output from the data input/output pad EDQP.

As viewed from outside of the semiconductor storage device 100, the overall read latency is a value in which a single clock cycle has been added (which is the latency of the interface chip 120 itself) to the read latency RL of the memory chips 110 to 113, that is to say, a value that is equal to RL+1, as shown in FIG. 13. Therefore, the value obtained by adding the latency of the interface chip 120 as such to the value of the mode register of the memory chips 110 to 113 is set as the read latency RL in the mode register MR on the interface chip 120.

Thus, the present embodiment involves receiving data that uses an internal strobe signal DQSI generated by the strobe signal generation circuit DSG, allowing an adequate operating margin to be assured even when the operating frequency is high. Since the value of the terminating resistance and the impedance of the output buffer can be controlled, distortion of the data transfer waveform is controlled, and, as a result, the operating margin can be expanded.

Next, the signal amplitude between the memory chips 110 to 113 and the interface chip 120 is described.

Figure 14:
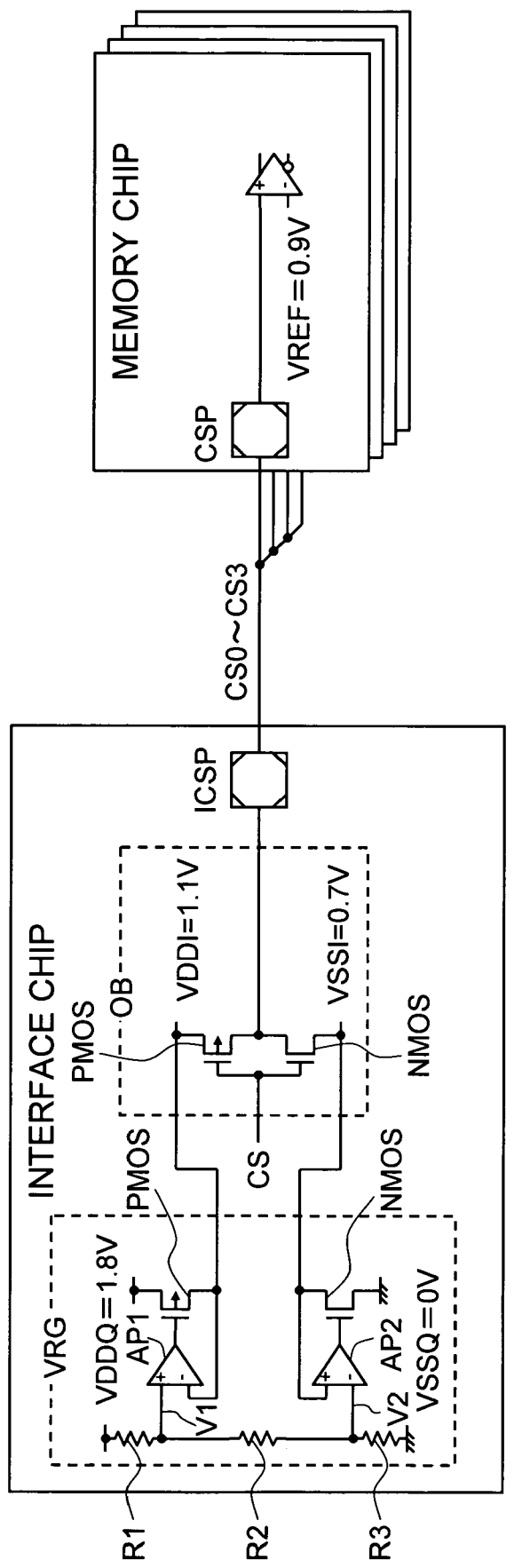
FIG. 14 is a schematic diagram that describes the method for reducing the amplitude of the inter-chip interface between the memory chips and the interface chip.

FIG. 14 is a schematic diagram that describes the method for reducing the amplitude of the inter-chip interface between the memory chips 110 to 113 and the interface chip 120. As an example, the case is shown in which the amplitude of the chip select signals CS0 to CS3 is reduced, but the same method may be adopted for the other signals as well.

In the present example, in the output buffer OB contained in the interface chip 120, an inverter with a CMOS structure is used as the output buffer for providing output to the memory chips 110 to 113, as shown in FIG. 14. An internal power supply voltage VDDI on the high level side of the inverter is kept at a lower level than the externally supplied power supply VDDQ, and the internal power supply voltage VSSI on the low level side is kept at a higher level than the externally supplied power supply VSSQ. If, for example, the VDDQ is 1.8 V, the VDDI may be set to about 1.1 V. Also, if the VSSQ is 0 V, the VSSI may be set to about 0.7 V.

When a signal (the chip select signal CS in FIG. 14) to be output is input to the input terminal of an inverter in which such internal power supply voltages VDDI and VSSI are used, the signal output has reduced amplitude. In this case, the threshold value of the NMOS and PMOS that constitute the inverter is preferably set to be lower than that of an ordinary device in order to increase speed. When set in this fashion, the amplitude of the data signals can be reduced without providing a terminating resistance in the wiring.

The internal power supply voltages VDDI and VSSI can be generated by a step-down circuit VRG. The step-down circuit VRG is composed of resistors R1 to R3 that produce reference voltages V1 and V2; differential amps AP1 and AP2 in which the reference voltages V1 and V2 are supplied to a non-inverted input terminal (+) and an inverted input terminal (−) respectively; and a PMOS and NMOS in which the outputs of the differential amps AP1 and AP2 are fed to the gates, respectively. The drains of the PMOS and NMOS are connected to the inverted input terminal (−) of the differential amp AP1 and the non-inverted input terminal (+) of the differential amp AP2, respectively; and the electric potentials are the internal power supply voltages VDDI and VSSI, respectively.

If such a low-amplitude output buffer is used, the charge and discharge power can be considerably reduced by charging and discharging the parasitic capacitance of the wiring INW and the bonding pad when a command/address or data is transferred.

Another feature of in the present embodiment is that since four memory chips 110 to 113 are mounted in a single package, there may be a problem in that the temperature inside the package may increase due to the power consumption of the memory chips 110 to 113, but if the power consumption due to signal transfer between the chips is reduced by using a low-amplitude output buffer, the temperature increase inside the package can be inhibited, and, as a result, the data retention time of the memory chips 110 to 113 can be extended.

The low-amplitude output buffer may be used not only on the interface chip 120 side, but also on the memory chips 110 to 113 side.

As described above, the semiconductor storage device 100 of the present embodiment has a configuration in which a plurality of memory chips 110 to 113 that are capable of independently carrying out read and write operations are stacked, and the plurality of memory chips 110 to 113 are externally connected by way of an interface chip 120. For this reason, the chip connected to the command/address external terminal group CA and the data input/output external terminal group DQ is a single chip (interface chip 120), and parasitic capacitance of the external terminals can be reduced to an amount that is about equal to that of a single chip component.

The frequency of the command/address and data input/output can be increased thereby to an amount that is equal to about that of a single chip component. Additionally, since the memory chips 110 to 113 are three-dimensionally stacked, the mounting surface area can be reduced to an amount equal to a single chip component.

As viewed from external circuitry, the interface chip 120 can be handled as an ordinary general-purpose DRAM, making it possible to assure compatibility with ordinary semiconductor storage devices that are packaged in only a single chip. For this reason, there is no need to design a special-purpose memory controller or the like, and an increase in the cost of the system overall can be held in check.

Since the stacked memory chips 110 to 113 are ordinary memory chips (general-purpose DRAM) that are each independently capable of read and write operations, a special step for forming a through-electrode or carrying out other processes is not required. For this reason, it is also possible to hold down increases in manufacturing costs.

In the present embodiment, the command/address signals and data input/output signals are connected in the form of a bus inside the package, making it possible to keep the number of wires inside the package low and thereby to hold manufacturing costs in check. Since any one of the chip select signals CS0 to CS3 is activated by decoding the higher bits A14 and A15 of the row address during read and write operations, the interface chip 120 can selectively activate the memory chips 110 to 113, and the overall power consumption of the stacked package can be reduced.

In the embodiment described above, common, general-use DRAM is used for the memory chips 110 to 113, but the data transfer speed between the memory chips 110 to 113 and the interface chip 120 can be further increased by separating the pads for normal use and the pads for testing as the pads of the memory chips 110 to 113. This method is described in FIG. 15.

Figure 15:
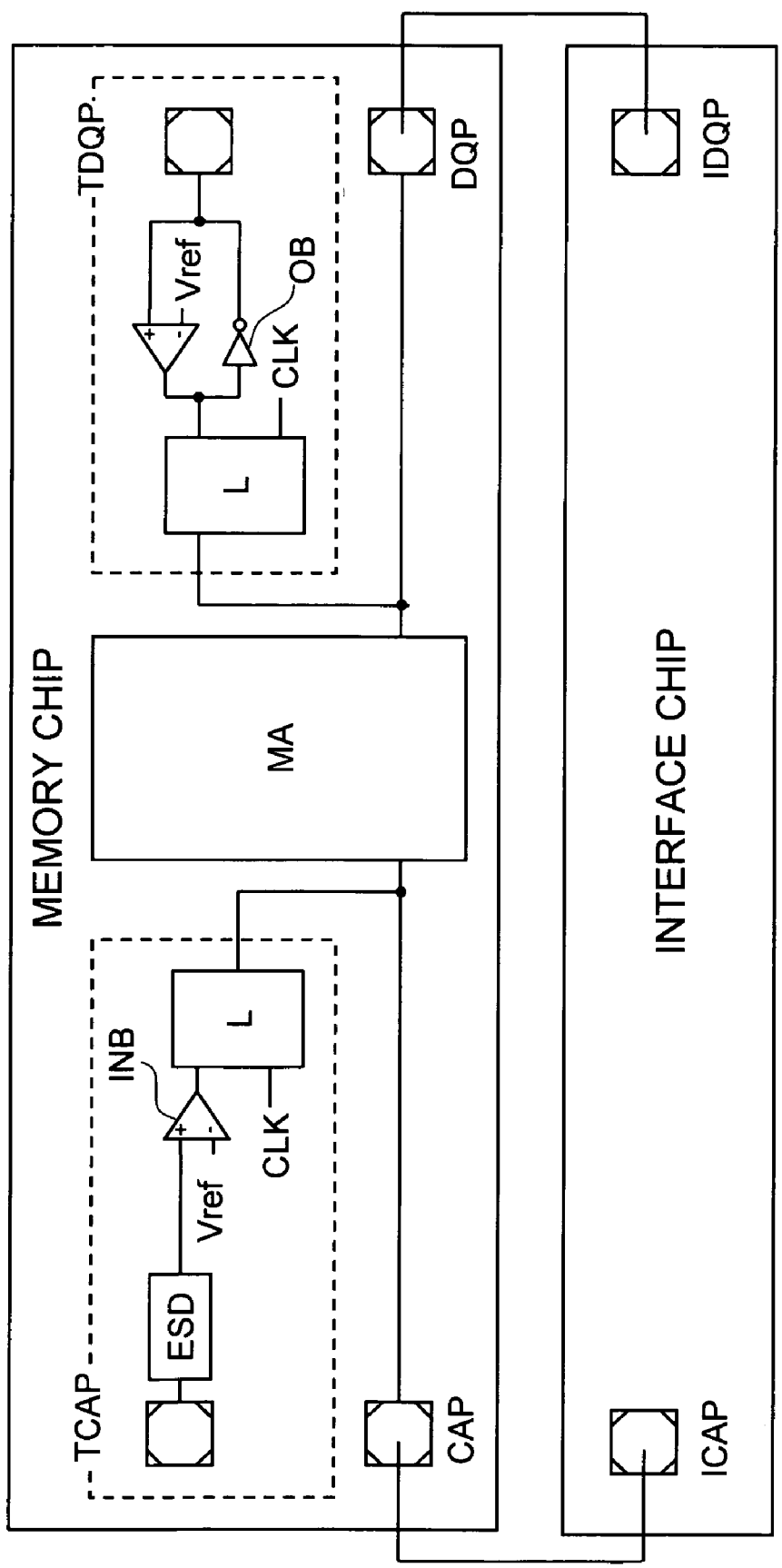
FIG. 15 is a diagram for describing an improved method for connecting the pads and the memory array in the memory chips.

FIG. 15 is a diagram for describing an improved method for connecting the pads and the memory array MA in the memory chips 110 to 113. For the sake of simplicity, only the command/address pad CAP and the data input/output pad DQP are depicted, but the chip select signal pad CSP may also be handled in the same manner as the command/address pad CAP.

In the present example, in addition to being provided with the command/address pad CAP and the data input/output pad DQP for normal use, the memory chips 110 to 113 are also provided with a test command/address pad TCAP and a test data input/output pad TDQP, as shown in FIG. 15. Although not depicted, a test pad that corresponds to the chip select signal pad CSP is also provided.

The test command/address pad TCAP has an electrostatic protection element ESD, an input buffer INB, and a latch circuit L. The test data input/output pad TDQP has an output buffer OB, an input buffer INB, and a latch circuit L. In contrast to this configuration, the command/address pad CAP and data input/output pad DQP for normal use are not connected to such circuitry and are essentially directly connected to the memory array MA, as shown in FIG. 15.

The test command/address pad TCAP and the test data input/output pad TDQP are pads that are used when the memory chips 110 to 113 are tested. More specifically, since the parasitic capacitance of the wiring is considerable, a tester used for testing the memory chips 110 to 113 requires an output buffer with a relatively high driving force, an input buffer with high sensitivity, and an electrostatic protection element.

In contrast, the chip connections are made with very short distance wires in terms of practical use, and since the parasitic capacitance is very low in comparison with the tester, the driving force of the output buffer OB may be fairly low, and there is no requirement that an input buffer INB with such a high sensitivity be used. Also, the necessity to provide an electrostatic protection element ESD is also low. Considering this point, in the present example, the electrostatic protection element ESD, the input buffer INB, and the like are bypassed, and the pads and memory array MA are essentially directly connected.

Testing can thereby be correctly carried out during the testing procedure, the data transfer speed between the memory chips 110 to 113 and the interface chip 120 can be increased during actual use, and power consumption can be reduced.

A second preferred embodiment of the present invention is described next.

The semiconductor storage device 200 of the second embodiment of the present invention is exactly the same as the semiconductor storage device 100 of the first embodiment described above in terms of the external appearance and the memory chips 110 to 113 that are used, but are different in terms of the interface chip that is used and the manner in which the memory chips 110 to 113 and the interface chip are connected. For this reason, a duplicative description of the portions that are the same as the first embodiment is omitted.

Figure 16:
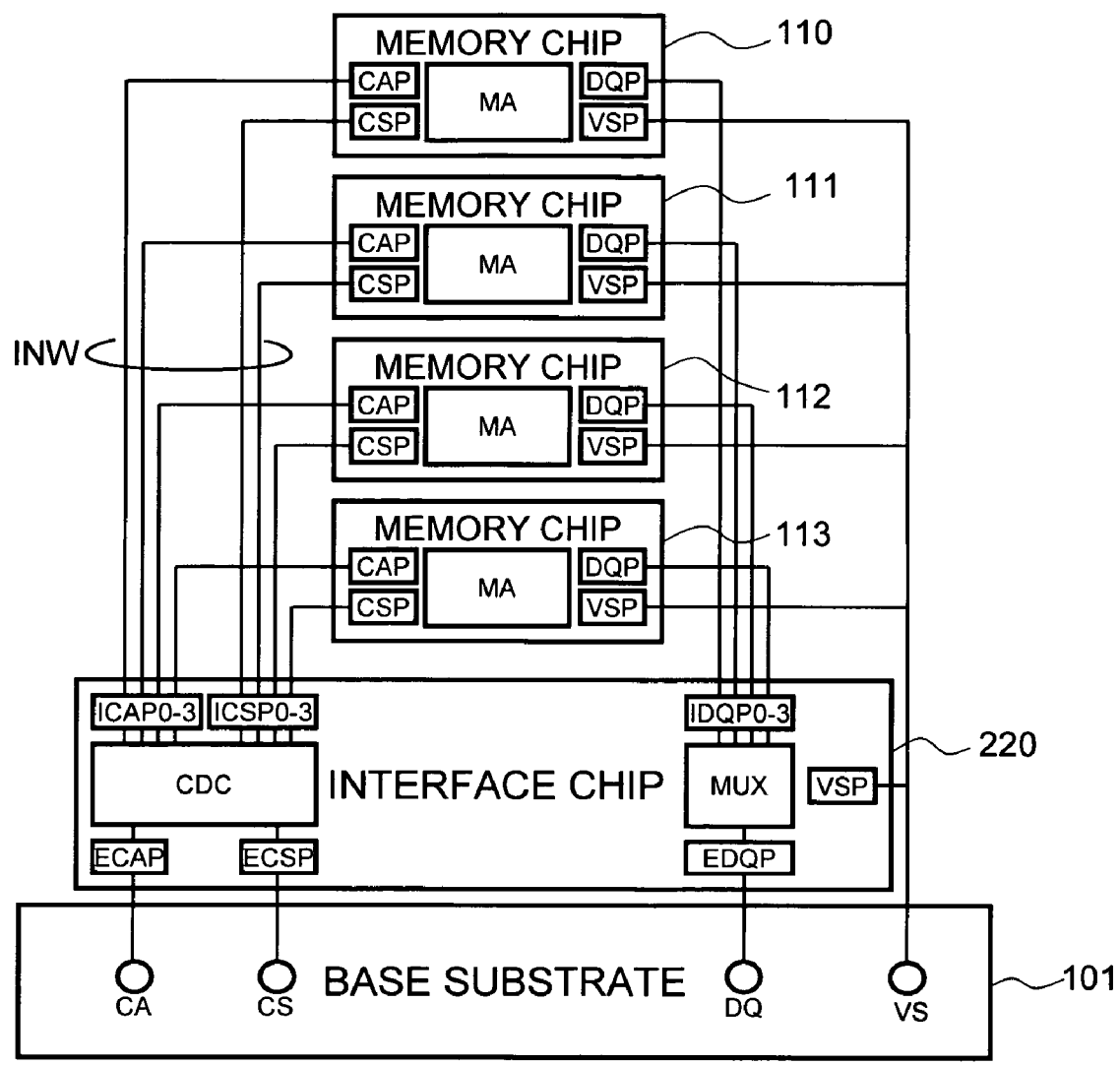
FIG. 16 is a schematic diagram of the connection configuration between the memory chips and the interface chip of the second embodiment.

FIG. 16 is a schematic diagram of the connection configuration between the memory chips 110 to 113 and the interface chip 220 of the present embodiment.

In the present embodiment, all of the signals are connected in a one-to-one relationship between the memory chips 110 to 113 and the interface chip 220, as shown in FIG. 16. In other words, not only are the chip select signals connected in a one-to-one relationship, but the command/address signals and data signals are also connected in such a relationship. The power supply is bus connected. Therefore, in the present embodiment, all of the signals transferred between the memory chips 110 to 113 and the interface chip 220 are individual signals for each memory chips 110 to 113.

Described more specifically, the command/address external terminal group CA and chip select signal external terminal CS are connected, respectively, to the command/address pad ECAP and the chip select signal pad ECSP on the interface chip 220 by way of the ball electrodes EXB on the base substrate 101. These signals are input to the command decoder CDC, and the four outputs of the decoder are output, respectively, to the command/address pads ICAP0 to ICAP3 and chip select signal pads ICSP0 to ICSP3, which are individually assigned to the memory chips 110 to 113.

The signals (command and address) output to the command/address pads ICAP0 to ICAP3 are individually fed to the command/address pad CAP of the four memory chips 110 to 113. The four chip select signals that are output to the chip select signal pads ICSP0 to ICSP3 are also connected in a one-to-one relationship between the interface chip 220 and memory chips 110 to 113, respectively.

The data input/output external terminal group DQ is connected to the data input/output pad EDQP on the interface chip 220 by way of the ball electrodes EXB on the base substrate 101. The data input/output signals are input to a bidirectional multiplexer MUX, and are connected to the data input/output pad DQP of the memory chips 110 to 113, respectively, by way of the data input/output pads IDQP0 to IDQP3 that are individually assigned to the memory chips 110 to 113.

To be written to the memory chips 110 to 113, the data is input to the interface chip 220 from outside the semiconductor storage device 100 by way of the data input/output external terminal group DQ, and write data is sent to only one of the memory chips 110 to 113 selected by way of the bidirectional multiplexer MUX. When data is read from the memory chips 110 to 113, the read data from the selected chip of the memory chips 110 to 113 is input to the interface chip 220 and is output to the data input/output external terminal group DQ by way of the bidirectional multiplexer.

The power supply external terminal group VS is connected directly to the power supply pads VSP of the memory chips 110 to 113 and the interface chip 220 by way of the ball electrodes EXB on the base substrate 101.

Thus, in the present embodiment, since the command/address signals and data input/output signals are connected in a one-to-one relationship inside the package, only the input/ output circuits of two transmitting and receiving channels are connected to the wiring INW inside the package. For this reason, the parasitic capacitance of the wiring INW can be reduced, and the charging and discharging electric current of the parasitic capacitance (which is a problem when high speed signals are transmitted) can be reduced.

Figure 17:
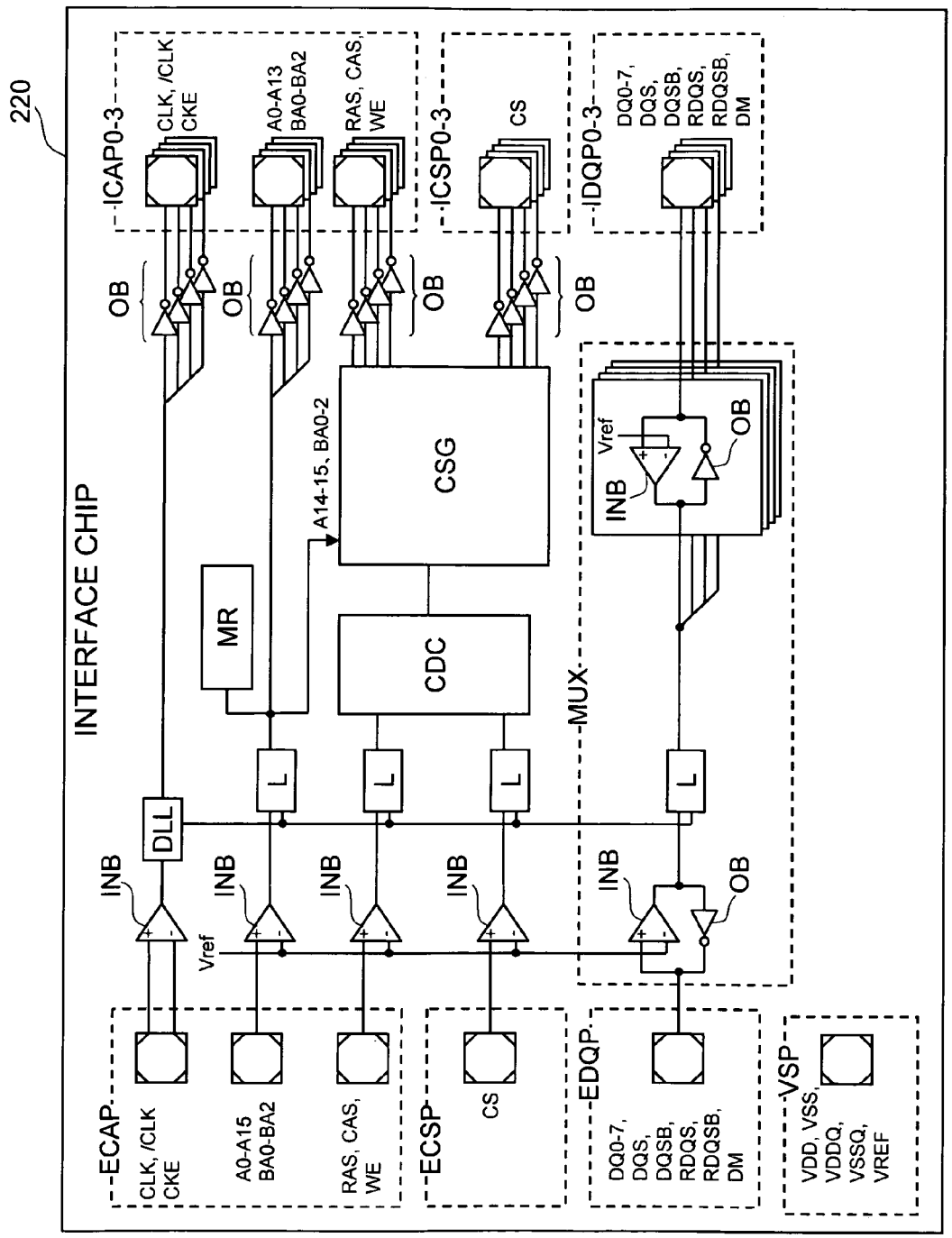
FIG. 17 is a simplified circuit diagram showing the circuit configuration of the interface chip shown in FIG. 16 used in the second embodiment.

FIG. 17 is a simplified circuit diagram showing the circuit configuration of the interface chip 220 used in the present embodiment.

The interface chip 220 used in the present embodiment, as shown FIG. 17, is different from the interface chip 120 shown in FIG. 5 in that command/address pads ICAP are individually provided to the memory chips 110 to 113 (ICAP0 to ICAP3), output buffers OB are individually provided in a corresponding relationship, data input/output pads IDQP are individually provided to the memory chips 110 to 113 (IDQP0 to IDQP3), and bidirectional repeaters are substituted for the bidirectional multiplexer MUX in a corresponding relationship. Other than the above, the configuration is the same as the interface chip 120 shown in FIG. 5.

Figure 18:
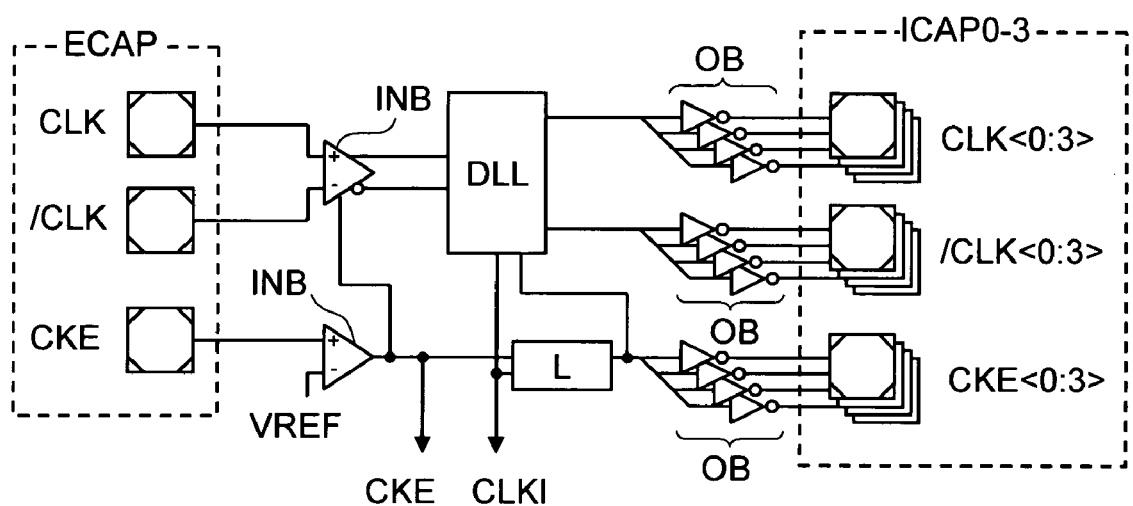
FIG. 18 is a diagram showing in greater detail the circuit configuration of the clock system circuit contained in the interface chip shown in FIG. 17.

FIG. 18 is a diagram showing in greater detail the circuit configuration of the clock system circuit contained in the interface chip 220.

The clock system circuit contained in the interface chip 220, as shown in FIG. 18, is different than the clock system circuit of the interface chip 120 shown in FIG. 6 in that the pads for feeding the complimentary clock signals CLK and /CLK and the clock enable signal CKE are individually provided to the memory chips 110 to 113 (ICAPO to ICAP3), and output buffers OB are independently provided in a corresponding relationship. Other than the above, the configuration is the same as the clock system circuit shown in FIG. 6.

Figure 19:
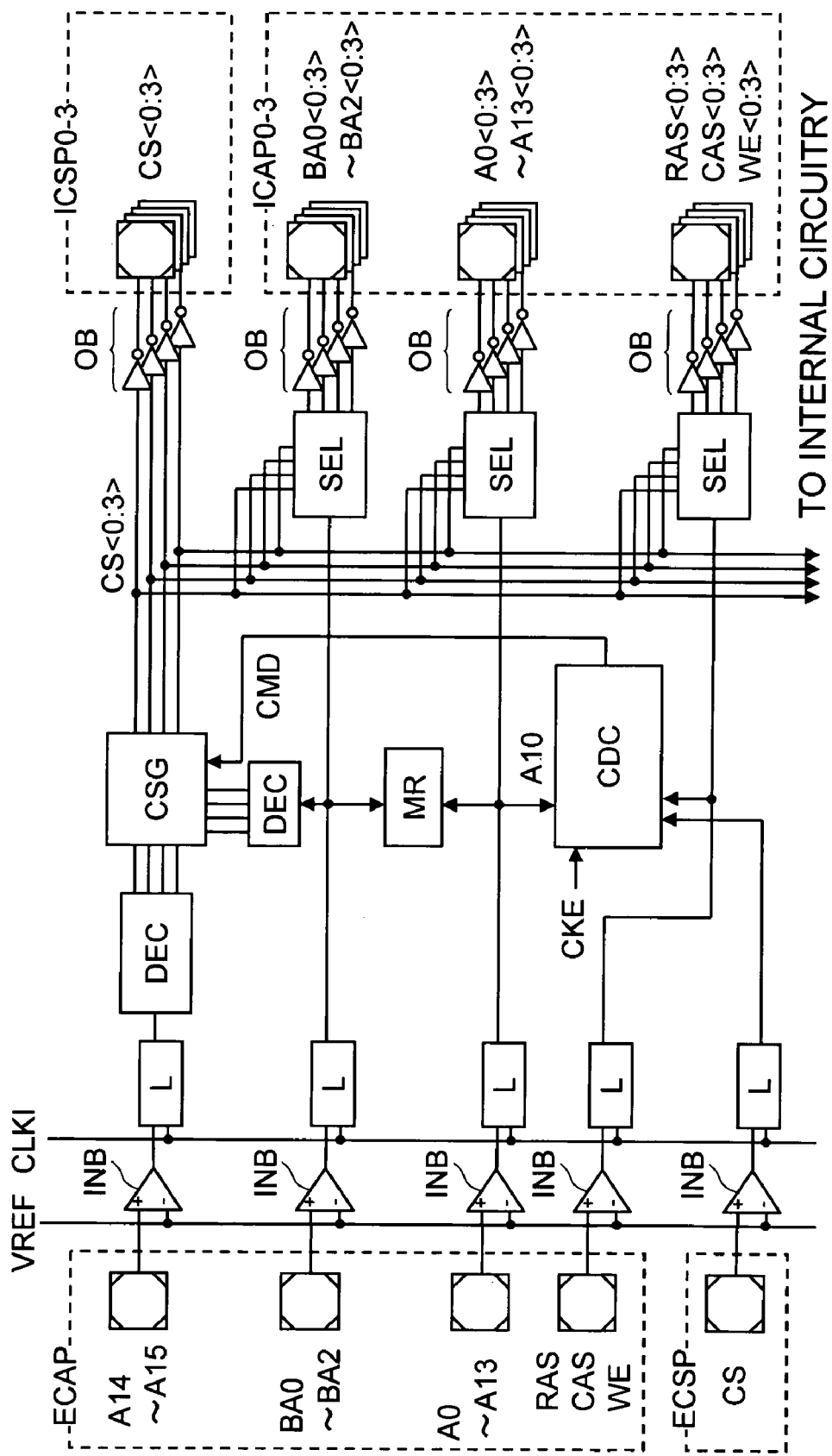
FIG. 19 is a diagram showing in greater detail the circuit configuration of the command/address system circuit contained in the interface chip shown in FIG. 17.

FIG. 19 is a diagram showing in greater detail the circuit configuration of the command/address system circuit contained in the interface chip 220.

The command/address system circuit contained in the interface chip 220, as shown in FIG. 19, is different than the command/address system circuit of the interface chip 120 shown in FIG. 7 in that command/address pads ICAP are individually provided to the memory chips 110 to 113 (ICAP0 to ICAP3), output buffers OB are individually provided in a corresponding relationship, and selectors SEL for selectively activating the output buffers are also provided. Chip select signals CS0 to CS3 are fed to the selectors SEL, and the selectors SEL feed a signal only to the output buffers OB that correspond to the activated chip select signals CS0 to CS3. Therefore, commands and addresses are not fed to the unselected memory chips 110 to 113.

Figure 20:
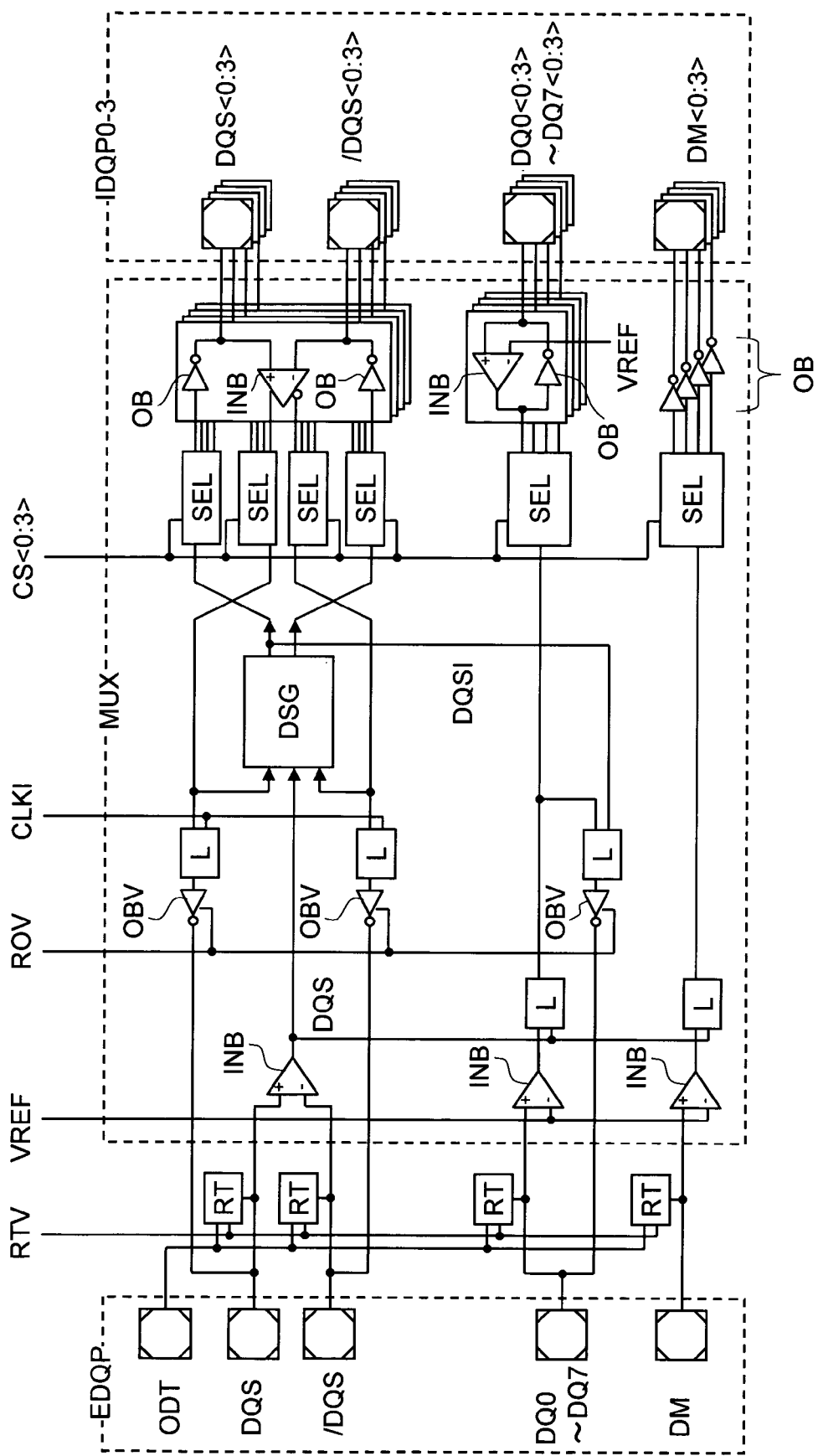
FIG. 20 is a diagram showing in greater detail the circuit configuration of the data system circuit contained in the interface chip shown in FIG. 17.

FIG. 20 is a diagram showing in greater detail the circuit configuration of the data system circuit contained in the interface chip 220.

The data system circuit contained in the interface chip 220, as shown in FIG. 20, is different than the data system circuit of the interface chip 120 shown in FIG. 11 in that data input/output pads IDQP are individually provided to the memory chips 110 to 113 (IDQPO to IDQP3), input buffers INB and output buffers OB are individually provided in a corresponding relationship, and selectors SEL that selectively activate the output buffers are also provided.

In the same manner as the command/address system circuit, chip select signals CS0 to CS3 are fed to the selectors SEL, the selectors SEL feed a signal only to the output buffers OB that correspond to the activated chip select signals CS0 to CS3, and only the output of the input buffers INB corresponding to the activated chip select signals CS0 to CS3 are allowed to pass. Therefore, data is not fed to the unselected memory chips 110 to 113.

The semiconductor storage device 200 of the present embodiment can achieve substantially the same effects as the semiconductor storage device 100 of the first embodiment described above, and since the command/address signals and data input/output signals are connected in a one-to-one relationship inside the package, the parasitic capacitance of the wiring INW inside the package can be reduced. The charging and discharging electric current of the parasitic capacitance (which is a problem when high speed signals are transmitted) can thereby be reduced.

In the present embodiment, both the command/address signals and data input/output signals are connected in a one-to-one relationship, but since the speed of the command/address signals is half the speed of the data input/output signals in a DDR-type DRAM, power consumption does not always become a large problem for command/address signals. Considering this point, the command/address signals are bus-connected in the same manner as in the first embodiment, and the data input/output signals may be connected in a one-to-one relationship. According to this configuration, it is possible to reduce power consumption while keeping the number of wires inside the chip low.

A third preferred embodiment of the present invention is described next.

Figure 21:
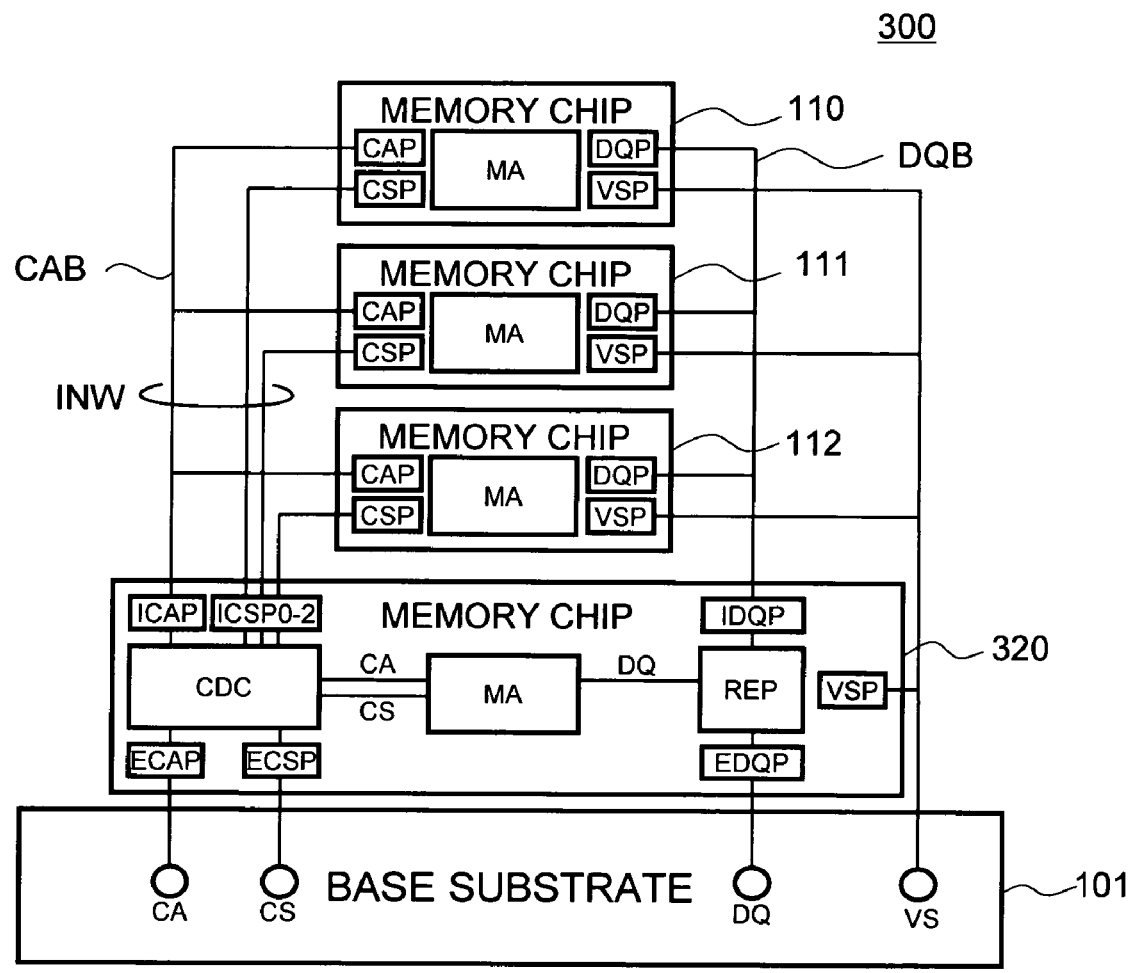
FIG. 21 is a schematic diagram that describes the connection configuration between the memory chips and the memory chip in the semiconductor storage device of the third embodiment of the present invention.
Figure 22:
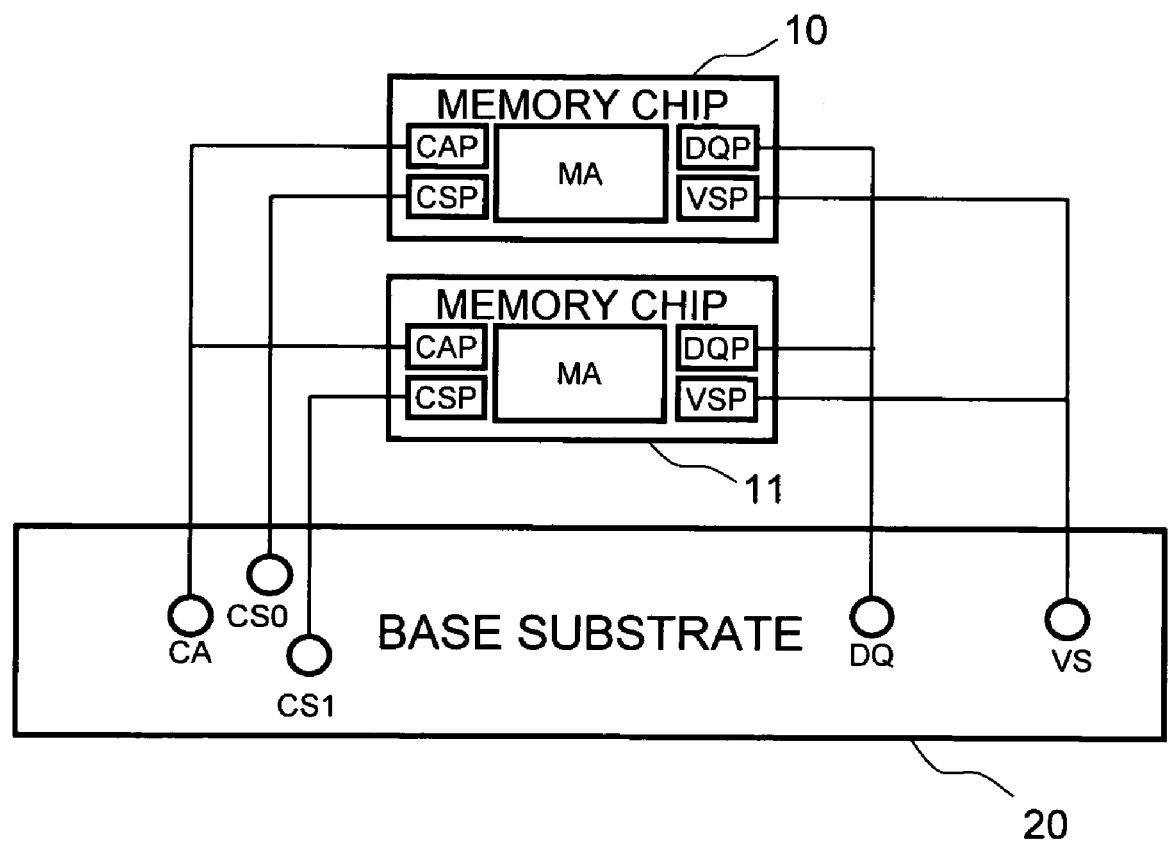
FIG. 22 is a schematic diagram of a conventional semiconductor storage device that is three-dimensionally stacked and packaged.

FIG. 21 is a schematic diagram that describes the connection configuration between the memory chips 110 to 112 and the memory chip 320 in the semiconductor storage device 300 of the third embodiment of the present invention.

In the present embodiment, the special-purpose interface chip is dispensed with. Instead, an interface chip function is provided to the memory chip 320 that is most proximate to the base substrate 101, as shown in FIG. 21. Other than the above, the configuration is the same as the semiconductor storage device 100 of the first embodiment described above. Signals other than the chip select signals CS0 to CS2 are bus-connected using the command/address bus CAB and the data bus DQB between the memory chips 110 to 112 and the memory chip 320. According to the present invention, the number of chips can be reduced by one, and the thickness of the entire package can therefore be reduced. Also, since the number of wires and the load of the internal wiring INW can be reduced, power consumption can be further lowered.

In the present embodiment, both the command/address signals and the data input/output signals are bus-connected in the same manner as the semiconductor storage device 100 of the first embodiment, although it is also possible to connect both the command/address signals and the data input/output signals in a one-to-one relationship as in the semiconductor storage device 200 of the second embodiment. Another option is to bus-connect the command/address signals as in the first embodiment, and to connect the data input/output signals in a one-to-one relationship.

The present invention is in no way limited to the aforementioned embodiments, but rather various modifications are possible within the scope of the invention as recited in the claims, and naturally these modifications are included within the scope of the invention.

In the embodiments described above, four memory chips were used as an example, but the number of memory chips that may be used is not limited to four, and any number of memory chips may be used as long as this number is two or more.

In the embodiments described above, DRAM was used as the memory chip, but the present invention is not limited to this type of chip alone, and other types of memory chips may also be used as long as the memory chips are each independently capable of read operations and write operations.

What is claimed is:

1. A semiconductor storage device comprising:
   a base substrate having a command/address external terminal group to which command signals, address signals, and a clock signal are supplied, a data input/output external terminal group for inputting and outputting data signals, and a single chip select external terminal;
   a plurality of memory chips that are stacked on the base substrate and are each individually capable of reading and writing operations; and
   an interface chip having an interface function, wherein
   a plurality of terminals constituting said command/address external terminal group, a plurality of terminals constituting said data input/output external terminal group, and said single chip select external terminal are connected to the interface chip; and
   the interface chip further has at least a chip select signal generation circuit that can individually activate said plurality of memory chips based on said address signals supplied via said command/address external terminal group and latched in synchronism with the clock signal, and based on said chip select signal supplied via said chip select external terminal and latched in synchronism with the clock signal.

2. The semiconductor storage device as claimed in claim 1, wherein said interface chip is a memory chip having the interface function.

3. The semiconductor storage device as claimed in claim 1, wherein at least one of the signals selected from said command signals, said address signals, and said data signals are transmitted between said plurality of memory chips and said interface chip by way of wiring with a shared connection to said plurality of memory chips.

4. The semiconductor storage device as claimed in claim 1, wherein at least one of the signals selected from said command signals, said address signals, and said data signals are transmitted between said plurality of memory chips and said interface chip by way of wiring that is individually connected to the plurality of memory chips.

5. The semiconductor storage device as claimed in claim 1, wherein said chip select signal generation circuit activates one of said plurality of memory chips based on a portion of said address signals supplied via said command/address external terminal group which is different from a bank address when an activation command is issued.

6. The semiconductor storage device as claimed in claim 5, wherein said chip select signal generation circuit has an active bank register for storing the relationship between the selected bank and the memory chip that is to be activated, and activates one of said plurality of memory chips by referencing said active bank register when a read command or a write command is issued together with said bank address via said command/address external terminal group.

7. The semiconductor storage device as claimed in claim 1, wherein said chip select signal generation circuit sequentially activates said plurality of memory chips when a refresh command is issued.

8. The semiconductor storage device as claimed in claim 1, wherein said interface chip further has a clock regeneration circuit, and a clock regenerated by said clock regeneration circuit is supplied to said plurality of memory chips.

9. The semiconductor storage device as claimed in claim 1, wherein said interface chip further has a strobe signal generation circuit, and said interface chip outputs a data signal that is read from said memory chip via said data input/output external terminal group in synchronism with an output of said strobe signal generation circuit.

10. The semiconductor storage device as claimed in claim 1, wherein said interface chip has a terminating resistance that is connected to said data input/output external terminal group.

11. The semiconductor storage device as claimed in claim 1, wherein each of said plurality of memory chips has a bonding pad area, and said plurality of memory chips are connected to said base substrate by way of tape on which wiring is formed.

12. The semiconductor storage device as claimed in claim 1, wherein a first internal power supply voltage that is lower than an externally supplied high-level-side power supply voltage is applied as a high-level-side power supply voltage, and a second internal power supply voltage that is higher than the externally supplied low-level-side power supply voltage is applied as a low-level-side power supply voltage to an output buffer that is designed to provide output to said plurality of memory chips and is selected from the output buffers included in said interface chip.

13. The semiconductor storage device as claimed in claim 1, wherein said plurality of memory chips have a test pad in addition to an ordinary pad designed for actual use, said test pad is connected to a memory array at least via a buffer circuit, and said ordinary pad bypasses said buffer circuit and connects to said memory array.

14. A semiconductor storage device comprising:
   a base substrate having a command/address external terminal group to which command Signals, address signals, and a clock signal are supplied and a single chip select external terminal to which a chip select signal is supplied;
   an interface chip that is mounted on the base substrate and is connected to the command/address external terminal group and the chip select external terminal; and
   a plurality of memory chips that are stacked on the base substrate and are each individually capable of reading and writing operations,
   wherein said interface chip can individually activate said plurality of memory chips based on said address signals and said chip select signal latched in synchronism with the clock signal.

15. The semiconductor storage device as claimed in claim 14, wherein at least one of the signals selected from said command signals and said address signals are transmitted between said plurality of memory chips and said interface chip via wiring with a shared connection to said plurality of memory chips.

16. The semiconductor storage device as claimed in claim 14, wherein at least one of the signals selected from said command signals and said address signals are transmitted between said plurality of memory chips and said interface chip via wiring that is individually connected to the plurality of memory chips.

17. A semiconductor storage device comprising:
   a base substrate having a command/address external terminal group to which command signals and address signals are supplied and a single chip select external terminal to which a chip select signal is supplied; and
   a plurality of memory chips that are stacked on the base substrate and are each individually capable of reading and writing operations,
   wherein one of said plurality of memory chips is connected to the command/address external terminal group and the chip select external terminal and can individually activate said plurality of memory chips based on said address signals and said chip select signal.

18. The semiconductor storage device as claimed in claim 17, wherein at least one of the signals selected from said command signals and said address signals are transmitted between said one of said plurality of memory chips and remaining memory chips via wiring with a shared connection to said remaining memory chips.

19. The semiconductor storage device as claimed in claim 17, wherein at least one of the signals selected from said command signals and said address signals are transmitted between said one of said plurality of memory chips and remaining memory chips via wiring that is individually connected to the remaining memory chips.

* * * * *